United States Patent
Kim et al.

(10) Patent No.: US 10,552,182 B2
(45) Date of Patent: Feb. 4, 2020

(54) MULTIPLE DISPLAY DEVICE AND METHOD OF OPERATING THE SAME

(71) Applicant: Samsung Electronics Co., Ltd, Gyeonggi-do (KR)

(72) Inventors: Seongeun Kim, Gyeonggi-do (KR); Jungsik Park, Gyeonggi-do (KR); Woongeun Kwak, Gyeonggi-do (KR); Sangyong Kim, Gyeonggi-do (KR); Jaeyoung Shin, Gyeonggi-do (KR); Seungwon Oh, Seoul (KR); Dohun Cha, Gyeonggi-do (KR); Byounguk Yoon, Gyeonggi-do (KR); Hyunju Hong, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 263 days.

(21) Appl. No.: 15/458,896

(22) Filed: Mar. 14, 2017

(65) Prior Publication Data
US 2017/0262295 A1    Sep. 14, 2017

(30) Foreign Application Priority Data
Mar. 14, 2016   (KR) .......................... 10-2016-0030453

(51) Int. Cl.
*G06F 3/0481*   (2013.01)
*G06F 9/451*    (2018.01)
(Continued)

(52) U.S. Cl.
CPC ............ *G06F 9/452* (2018.02); *G06F 3/0484* (2013.01); *G06F 3/0486* (2013.01);
(Continued)

(58) Field of Classification Search
CPC .. G06F 3/0484; G06F 3/04812; G06F 3/0483; G06F 3/0488; G06F 3/04817; H04M 1/00; H05K 7/00; G09G 5/00
See application file for complete search history.

(56) References Cited

U.S. PATENT DOCUMENTS

| | | | |
|---|---|---|---|
| 8,405,978 B2 * | 3/2013 | Okutsu ................. | G06F 1/1616 16/326 |
| 8,416,217 B1 * | 4/2013 | Eriksson ............... | G06F 1/1616 178/18.09 |

(Continued)

FOREIGN PATENT DOCUMENTS

| | | | | |
|---|---|---|---|---|
| CN | 203588618 U | * | 5/2014 | |
| EP | 2626852 A2 | * | 8/2013 | ............. G09G 5/003 |

(Continued)

OTHER PUBLICATIONS

European Patent Office, "European Search Report," Application No. EP 17160152, dated May 11, 2017, 12 pages.

(Continued)

*Primary Examiner* — Steven P Sax

(57) ABSTRACT

A multiple display device with a number of display areas, and a method of operating the device are provided. The method includes: executing a first application, and displaying the first user interface on the first image-display area; displaying text or icons related to the second application on the third image-display area; receiving a first user input for selecting an item or action via the first image-display area; receiving, after receiving the first user input, a second user input for selecting the text or the icon via the third image-display area; and displaying the second user interface on the second image-display area, in response to the second user input, and processing the item or action, using the second application. Various embodiments are provided.

16 Claims, 33 Drawing Sheets

(51) Int. Cl.

| | | |
|---|---|---|
| *G06F 3/0486* | (2013.01) | |
| *G06F 3/14* | (2006.01) | |
| *G06F 3/0484* | (2013.01) | |
| *H04M 1/00* | (2006.01) | |
| *G06F 3/0488* | (2013.01) | |
| *H05K 7/00* | (2006.01) | |
| *G09G 5/00* | (2006.01) | |

(52) U.S. Cl.
CPC ........ *G06F 3/0488* (2013.01); *G06F 3/04817* (2013.01); *G06F 3/1423* (2013.01); *G09G 5/00* (2013.01); *H04M 1/00* (2013.01); *H05K 7/00* (2013.01); *G06F 2203/04803* (2013.01)

(56) References Cited

U.S. PATENT DOCUMENTS

| | | | |
|---|---|---|---|
| 2005/0264471 A1* | 12/2005 | Yamazaki | G06F 3/1446 345/1.1 |
| 2010/0156887 A1* | 6/2010 | Lindroos | G06F 1/1626 345/418 |
| 2010/0216514 A1 | 8/2010 | Smoyer et al. | |
| 2010/0231533 A1* | 9/2010 | Chaudhri | G06F 3/04817 345/173 |
| 2012/0106078 A1* | 5/2012 | Probst | G06F 1/1616 361/679.56 |
| 2013/0076591 A1* | 3/2013 | Sirpal | G06F 3/1438 345/1.3 |
| 2013/0076649 A1 | 3/2013 | Myers et al. | |
| 2013/0106921 A1* | 5/2013 | Nakayama | G06F 3/013 345/690 |
| 2013/0135178 A1* | 5/2013 | Miyahara | H04M 1/72522 345/1.3 |
| 2013/0201176 A1 | 8/2013 | Lee et al. | |
| 2014/0062976 A1* | 3/2014 | Park | G09G 5/00 345/204 |
| 2014/0191952 A1 | 7/2014 | Myers | |
| 2015/0074598 A1* | 3/2015 | Yao | G06F 3/0488 715/803 |
| 2015/0227166 A1* | 8/2015 | Lee | G06F 1/169 345/173 |
| 2015/0358390 A1* | 12/2015 | Starr | H04L 67/06 709/204 |
| 2016/0026381 A1* | 1/2016 | Kim | G06F 3/04817 715/761 |
| 2016/0034437 A1* | 2/2016 | Yong | G06Q 30/0241 715/202 |
| 2016/0034597 A1* | 2/2016 | Graf | G06F 3/0482 715/761 |
| 2016/0048316 A1* | 2/2016 | Bae | G06F 1/1626 715/800 |
| 2016/0070423 A1* | 3/2016 | Doan | G09G 5/14 715/783 |
| 2016/0162093 A1* | 6/2016 | Kim | G06F 3/0412 345/174 |
| 2016/0234566 A1* | 8/2016 | Suoknuuti | H04N 21/2665 |
| 2017/0293383 A1* | 10/2017 | Lee | G06F 3/048 |

FOREIGN PATENT DOCUMENTS

| | | |
|---|---|---|
| EP | 2626852 A2 | 8/2013 |
| KR | 1020140124303 A | 10/2014 |

OTHER PUBLICATIONS

European Patent Office, "Communication pursuant to Article 94(3) EPC," Application No. EP 17160152.9, dated Sep. 27, 2018, 11 pages.

* cited by examiner

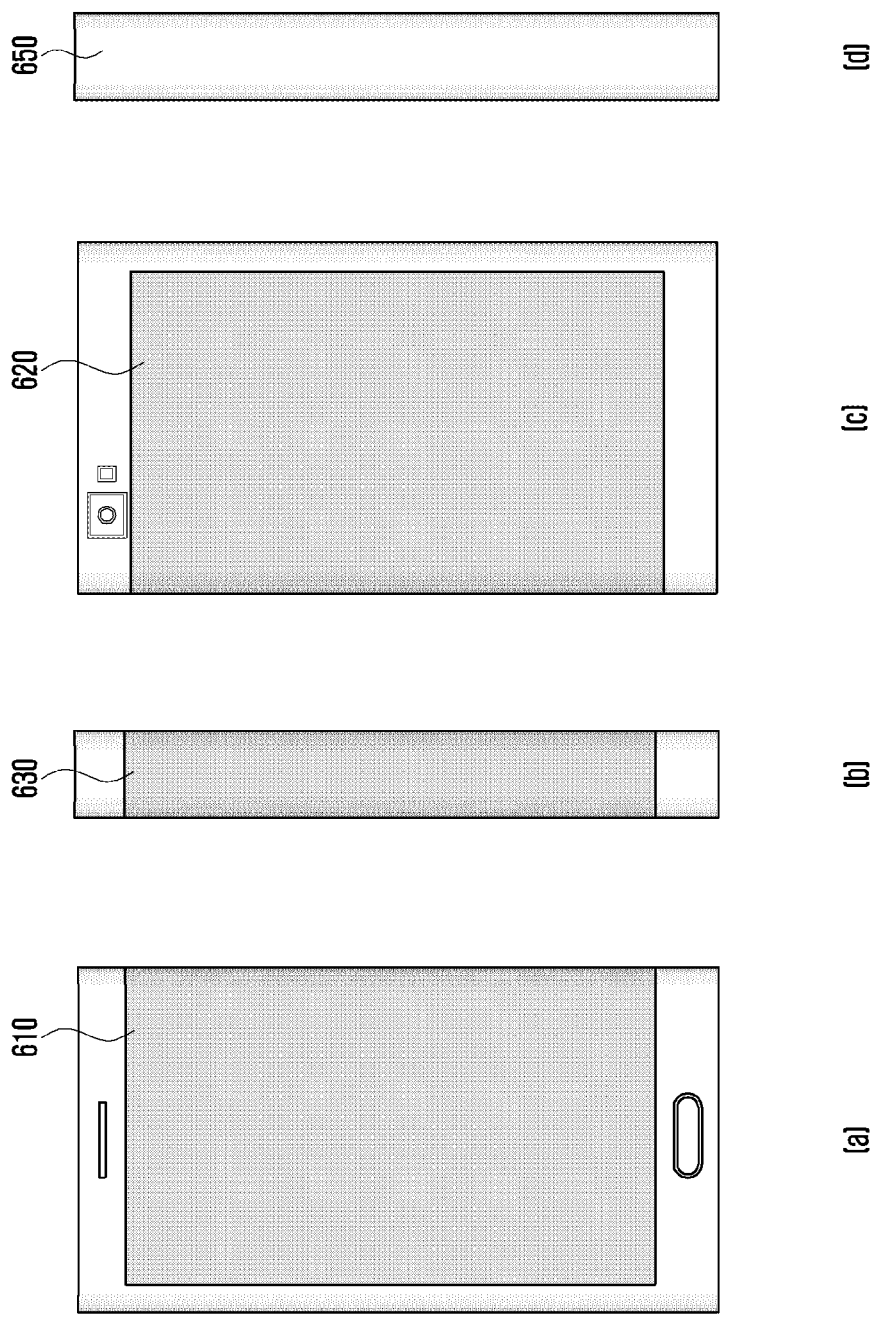

FIG. 17
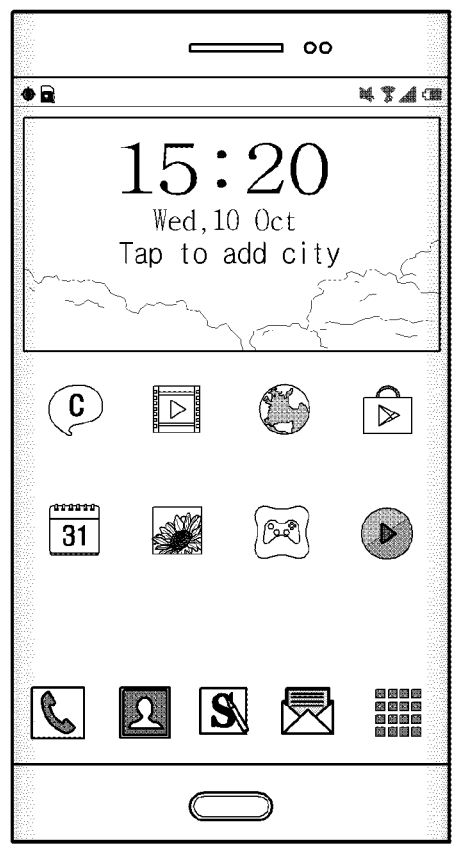
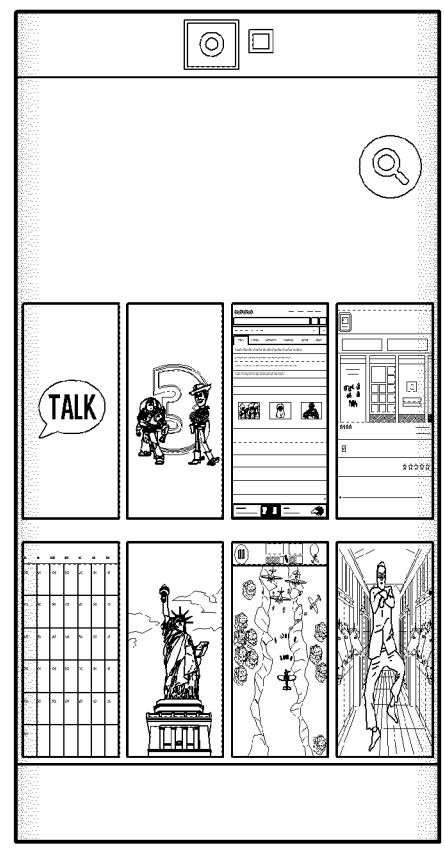
(a) (b)

[a]　　　　　　　　[b]

FIG. 19
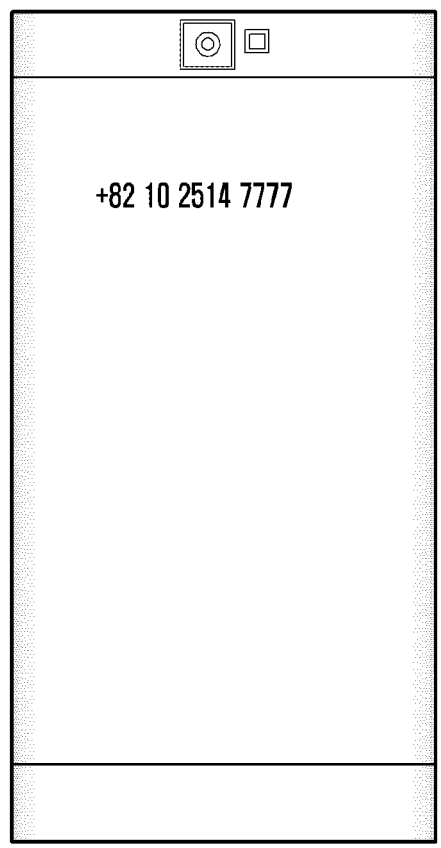
(a)  (b)

FIG. 20
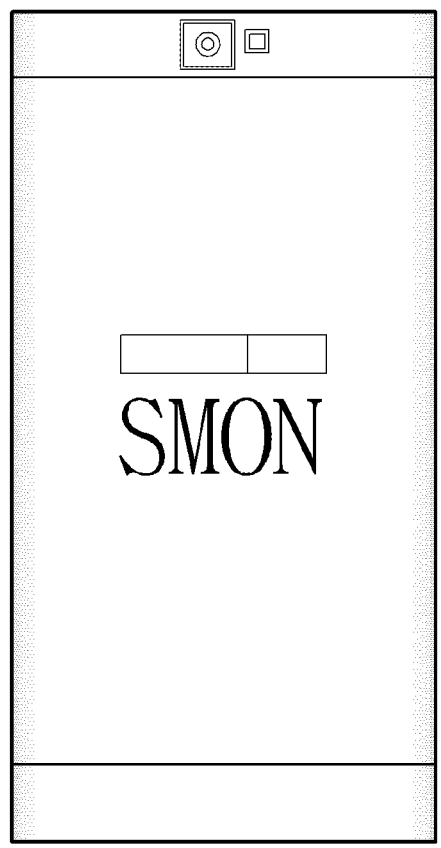
(a)　　　　　　　　　(b)

FIG. 23
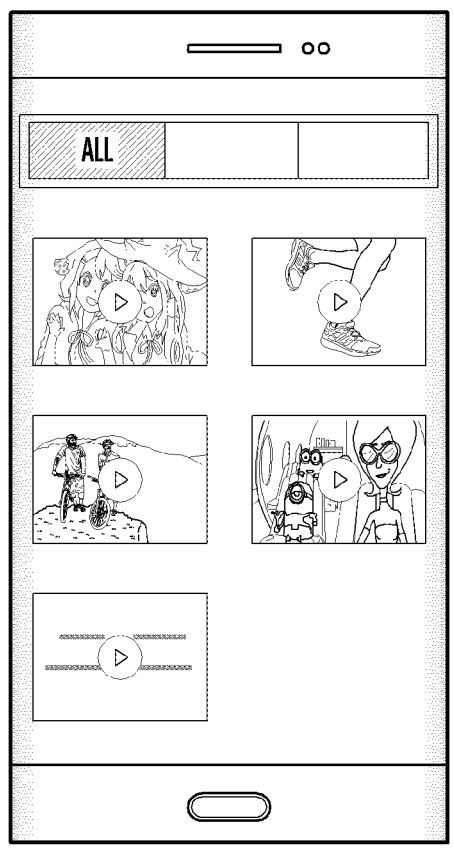
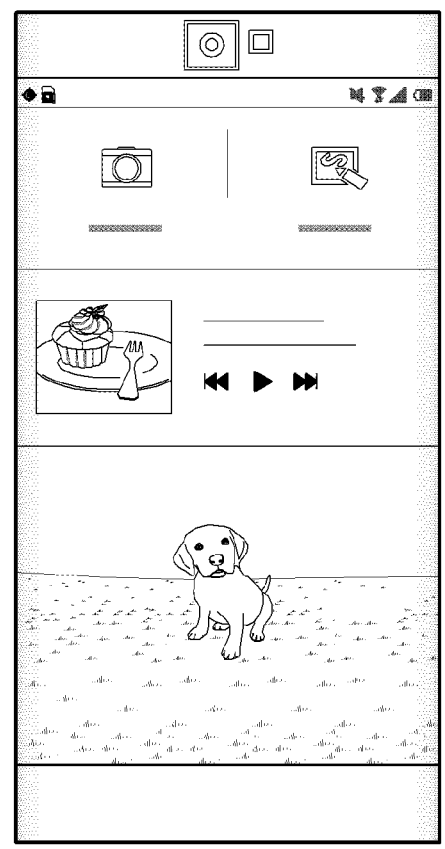
(a)  (b)

FIG. 25
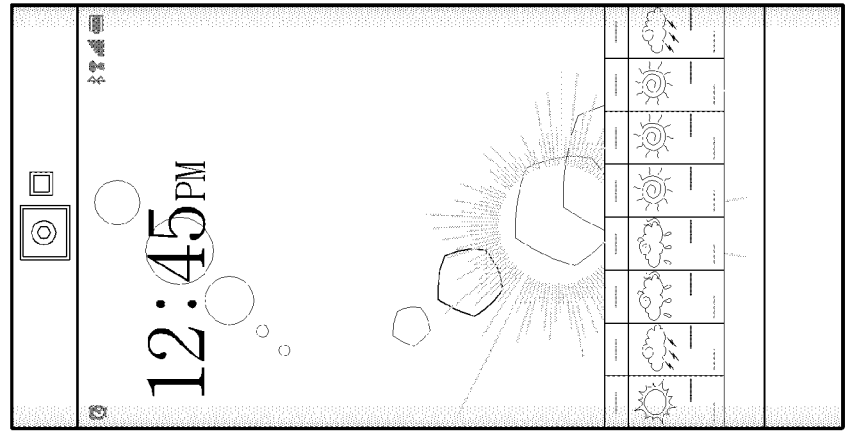
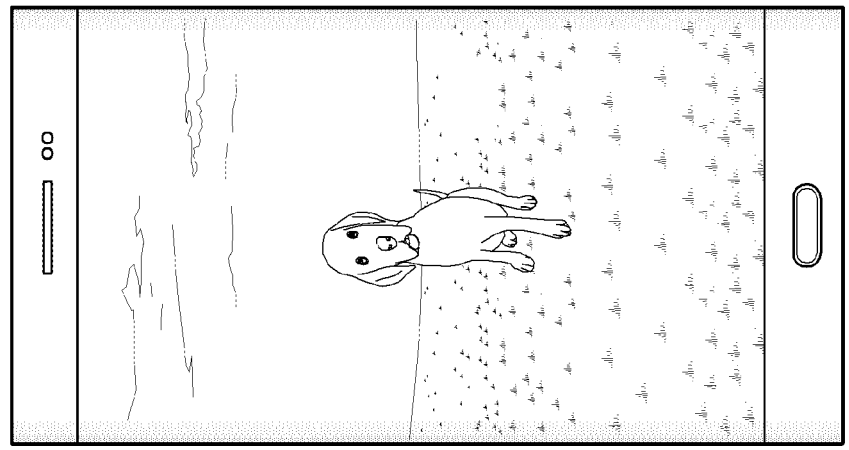
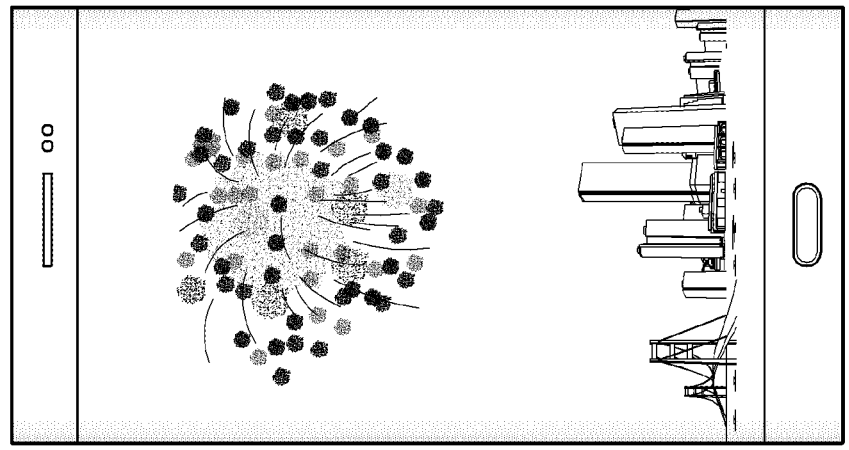

FIG. 30
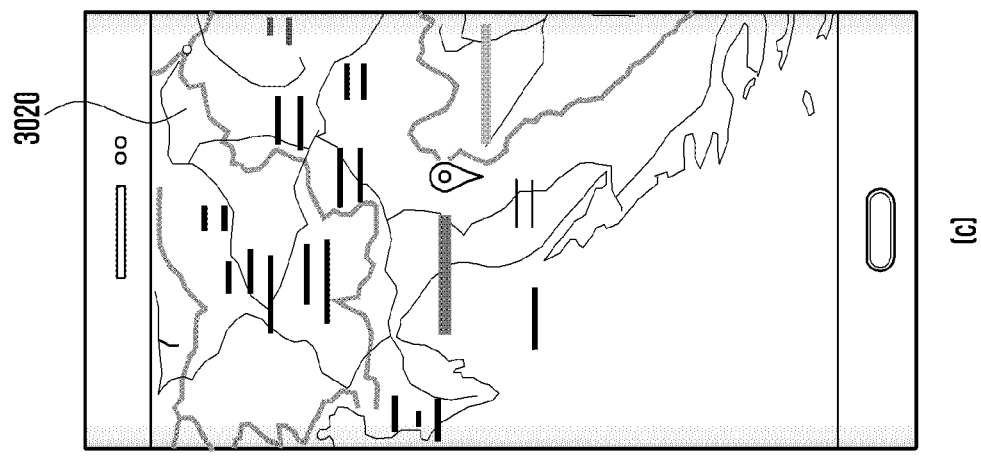
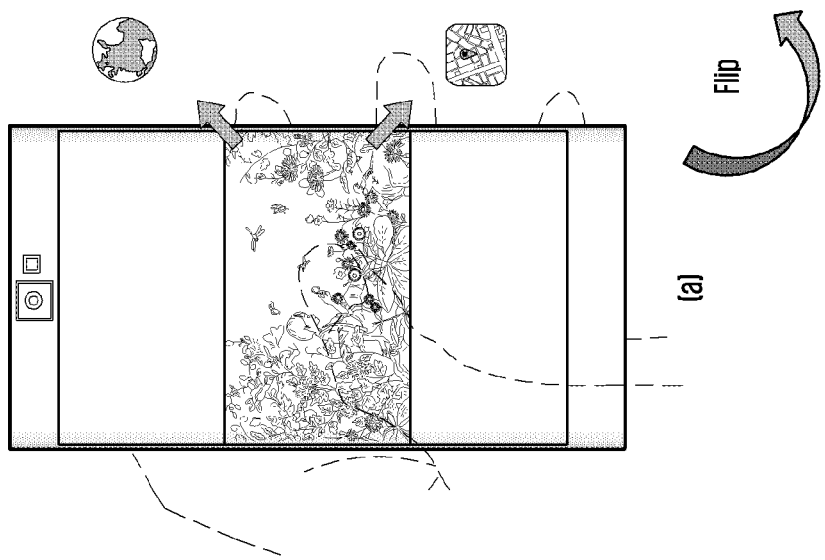

FIG. 31
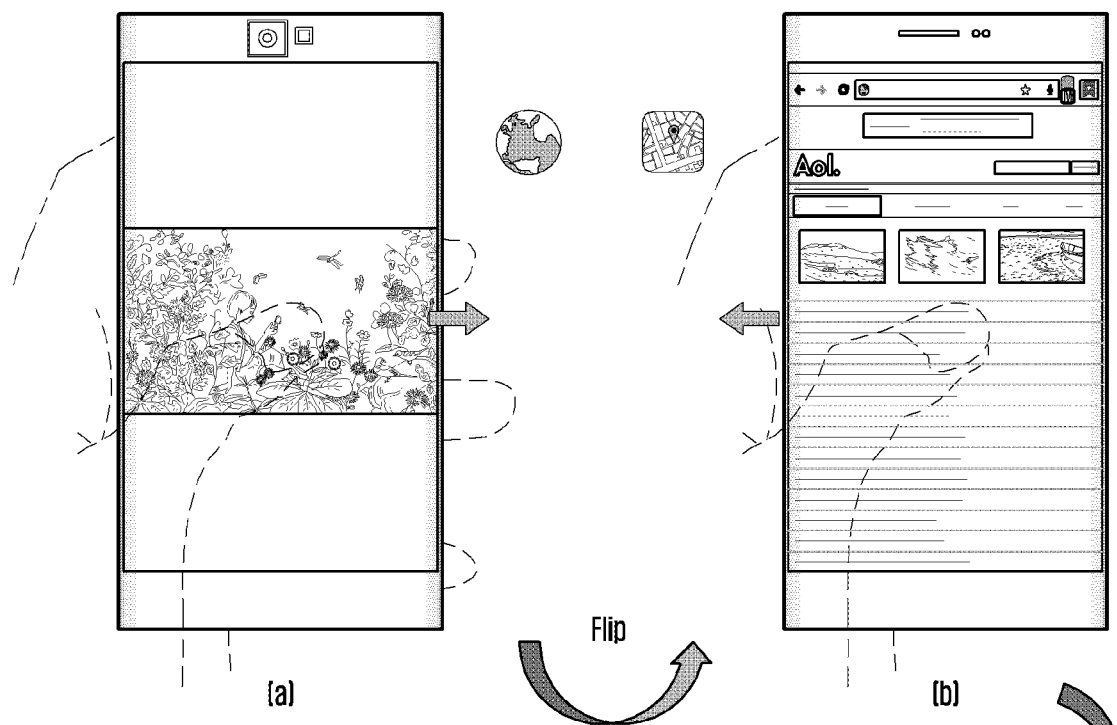
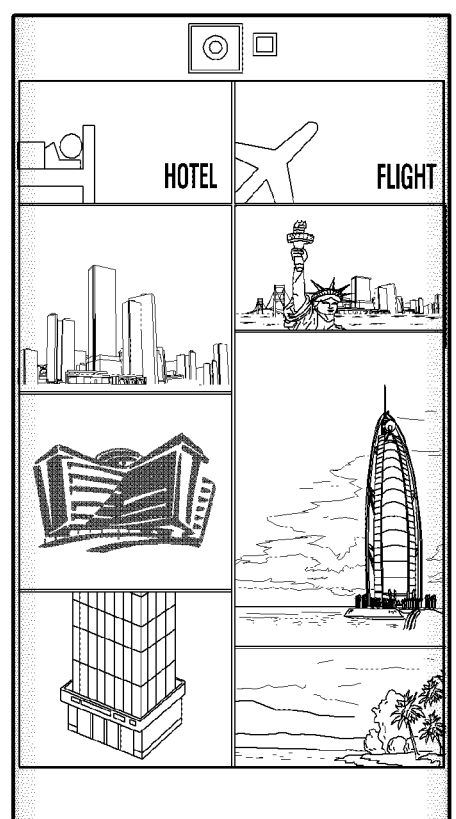

MULTIPLE DISPLAY DEVICE AND METHOD OF OPERATING THE SAME

CROSS-REFERENCE TO RELATED APPLICATION AND CLAIM OF PRIORITY

The present application is related to and claims the benefit under 35 U.S.C. § 119(a) of a Korean patent application filed on Mar. 14, 2016, in the Korean Intellectual Property Office and assigned Serial No. 10-2016-0030453, the entire disclosure of which is hereby incorporated by reference.

TECHNICAL FIELD

The present disclosure relates to a multiple display device with a number of display areas, and a method of operating the device.

BACKGROUND

A multiple display device is referred to as a device that is configured to include a number of display areas and allows users to view images shown on the display areas. A multiple display device may also provide interfaces to the display areas, so that users can easily access the interface on any of the display areas.

However, a multiple display device has the difficulty of being assembled or implemented because its body needs to be enclosed by the display areas. In addition, the multiple display device has not had various and convenient interfaces.

SUMMARY

To address the above-discussed deficiencies, it is a primary object to provide a multiple display device that is easily assembled and implanted and provides various interfaces to a number of display areas so that user can easily use the interface on the display areas. Various embodiments also provide a method of operating the multiple display device.

In accordance with an aspect of the present invention, an electronic device is provided. The electronic device includes: a housing including a first side facing a first direction, a second side facing a second direction opposite the first direction, and sides each of which partially encloses both edges of the first and second sides; a display including a first image-display area on the first side, a second image-display area on the second side, and third image-display areas on the sides; a communication circuit configured to perform wireless communication with an external device; a processor that is located in the housing and is electrically connected to the display and the communication circuit; and a memory that is located in the housing, is electrically connected to the processor, and stores a first application with a first user interface, a second application with a second user interface, and instructions. The instructions enable the processor to: display the first user interface on the first image-display area; display text or icons related to the second application on the third image-display area; receive a first user input for selecting an object located in the first image-display area; receive, when the first user input is received, a second user input for selecting the text or the icon located in the third image-display area; and; and display the second user interface on the second image-display area, in response to the second user input, and execute corresponding to the text or the icon.

In accordance with another aspect of the present invention, a method of operating a multiple display device is provided. The method includes: executing a first application, and displaying a first user interface on a first image-display area; displaying text or icons related to a second application on a third image-display area; receiving a first user input for selecting an object located in the first image-display area; receiving, when the first user input is received, a second user input for selecting the text or the icon located in the third image-display area; and executing the second application corresponding to the text or the icon, and displaying a second user interface on the second image-display area.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIGS. 6A, 6B and 6C illustrate diagrams of the outward appearance of an electronic device according to various embodiments of the present invention;

FIG. 17 illustrates diagrams of a background screen provided by an electronic device according to various embodiments of the present invention;

FIG. 19 illustrates diagrams that describe a method for an electronic device to provide an incoming call notification according to various embodiments of the present invention;

FIG. 20 illustrates diagrams that describe a method for an electronic device to provide an incoming call notification according to various embodiments of the present invention;

FIG. 23 illustrates diagrams of screens when an electronic device runs a media playback application according to various embodiments of the present invention;

FIG. 25 illustrates diagrams of idle screens when an electronic device operates in an idle mode according to various embodiments of the present invention;

FIG. 30 illustrates diagrams that describe a method of operating an electronic device according to various embodiments of the present invention; and FIG. 31 illustrates diagrams that describe a method of operating an electronic device according to various embodiments of the present invention.

DETAILED DESCRIPTION

Figure 1:
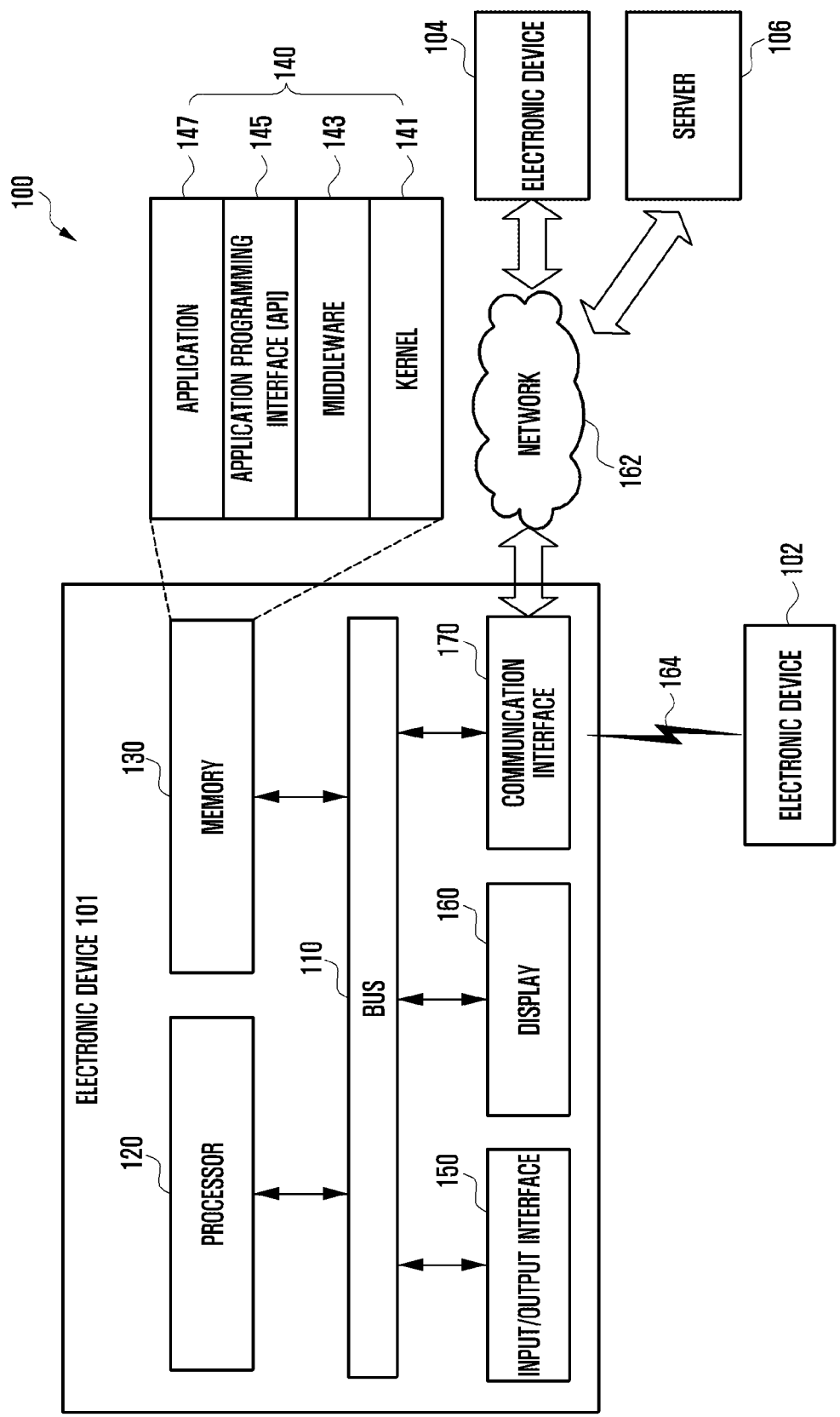
FIG. 1 illustrates a network environment including an electronic device according to various embodiments of the present invention.

FIGS. 1 through 31, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged electronic device.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The expressions such as "include" and "may include" may denote the presence of the disclosed functions, operations, and constituent elements and do not limit one or more additional functions, operations, and constituent elements. Terms such as "include" and/or "have" may be construed to denote a certain characteristic, number, operation, constituent element, component or a combination thereof, but may not be construed to exclude the existence of or a possibility of addition of one or more other characteristics, numbers, operations, constituent elements, components or combinations thereof.

Furthermore, in the present disclosure, the expression "and/or" includes any and all combinations of the associated listed words. For example, the expression "A and/or B" may include A, may include B, or may include both A and B.

In the present disclosure, expressions including ordinal numbers, such as "first" and "second," etc., may modify various elements. However, such elements are not limited by the above expressions. For example, the above expressions do not limit the sequence and/or importance of the elements. The above expressions are used merely for the purpose to distinguish an element from the other elements. For example, a first user device and a second user device indicate different user devices although both of them are user devices. For example, a first element could be termed a second element, and similarly, a second element could be also termed a first element without departing from the scope of the present disclosure.

In the case where a component is referred to as being "connected" or "accessed" to other component, it should be understood that not only the component is directly connected or accessed to the other component, but also there may exist another component between them. Meanwhile, in the case where a component is referred to as being "directly connected" or "directly accessed" to other component, it should be understood that there is no component therebetween. The terms used in the present disclosure are only used to describe specific various embodiments, and are not intended to limit the present disclosure. As used herein, the singular forms are intended to include the plural forms as well, unless the context clearly indicates otherwise. Singular forms are intended to include plural forms unless the context clearly indicates otherwise.

An electronic device according to the present disclosure may be a device including a communication function. For example, the device corresponds to a combination of at least one of a smartphone, a tablet personal computer (PC), a mobile phone, a video phone, an e-book reader, a desktop PC, a laptop PC, a netbook computer, a personal digital assistant (PDA), a portable multimedia player (PMP), a digital audio player, a mobile medical device, an electronic bracelet, an electronic necklace, an electronic accessory, a camera, a wearable device, an electronic clock, a wrist watch, home appliances (for example, an air-conditioner, vacuum, an oven, a microwave, a washing machine, an air cleaner, and the like), an artificial intelligence robot, a television (TV), a digital video disk (DVD) player, an audio device, various medical devices (for example, magnetic resonance angiography (MRA), magnetic resonance imaging (MM), computed tomography (CT), a scanning machine, a ultrasonic wave device, or the like), a navigation device, a global positioning system (GPS) receiver, an event data recorder (EDR), a Flight data recorder (FDR), a set-top box, a TV box (for example, SAMSUNG HOMESYNC™, APPLE TV™, or GOOGLE TV™), an electronic dictionary, vehicle infotainment device, an electronic equipment for a ship (for example, navigation equipment for a ship, gyrocompass, or the like), avionics, a security device, electronic clothes, an electronic key, a camcorder, game consoles, a head-mounted display (HMD), a flat panel display device, an electronic frame, an electronic album, furniture or a portion of a building/structure that includes a communication function, an electronic board, an electronic signature receiving device, a projector, and the like. It is obvious to those skilled in the art that the electronic device according to the present disclosure is not limited to the aforementioned devices.

FIG. 1 is a block diagram illustrating a configuration of an electronic device according to an embodiment of the present disclosure.

Referring to FIG. 1, the electronic device 100 may include a bus 110, a processor 120, a memory 130, a user input module 150, a display module 160, a communication module 170, and other similar and/or suitable components.

The bus 110 may be a circuit that interconnects the above-described elements and delivers a communication (e.g., a control message) between the above-described elements.

The processor 120 may receive commands from the above-described other elements (e.g., the memory 130, the user input module 150, the display module 160, the communication module 170, etc.) through the bus 110, may interpret the received commands, and may execute calculation or data processing according to the interpreted commands.

The memory 130 may store commands or data received from the processor 120 or other elements (e.g., the user input module 150, the display module 160, the communication module 170, etc.) or generated by the processor 120 or the other elements. The memory 130 may include programming modules, such as a kernel 141, middleware 143, an application programming interface (API) 145, an application 147, and the like. Each of the above-described programming modules may be implemented in software, firmware, hardware, or a combination of two or more thereof.

The kernel 141 may control or manage system resources (e.g., the bus 110, the processor 120, the memory 130, etc.) used to execute operations or functions implemented by other programming modules 140 (e.g., the middleware 143, the API 145, and the application 147). Also, the kernel 141 may provide an interface capable of accessing and controlling or managing the individual elements of the electronic device 100 by using the middleware 143, the API 145, or the application 147.

The middleware 143 may serve to go between the API 145 or the application 147 and the kernel 141 in such a manner that the API 145 or the application 147 communicates with the kernel 141 and exchanges data therewith. Also, in relation to work requests received from one or more applications 147 and/or the middleware 143, for example, may perform load balancing of the work requests by using a method of assigning a priority, in which system resources (e.g., the bus 110, the processor 120, the memory 130, etc.) of the electronic device 100 can be used, to at least one of the one or more applications 147.

The API 145 is an interface through which the application 147 is capable of controlling a function provided by the kernel 141 or the middleware 143, and may include, for example, at least one interface or function for file control, window control, image processing, character control, or the like.

The user input module 150, for example, may receive a command or data as input from a user, and may deliver the received command or data to the processor 120 or the memory 130 through the bus 110. The display module 160 may display a video, an image, data, or the like to the user.

The communication module 170 may connect communication between another electronic device 102 and the electronic device 100. The communication module 170 may support a predetermined short-range communication protocol (e.g., Wi-Fi, BLUETOOTH (BT), and near field communication (NFC)), or predetermined network communication 162 (e.g., the Internet, a local area network (LAN), a wide area network (WAN), a telecommunication network, a cellular network, a satellite network, a plain old telephone service (POTS), or the like). Each of the electronic devices 102 and 104 may be a device that is identical (e.g., of an identical type) to or different (e.g., of a different type) from the electronic device 100. Further, the communication module 170 may connect communication between a server 106 and the electronic device 100 via the network 162.

Figure 2:
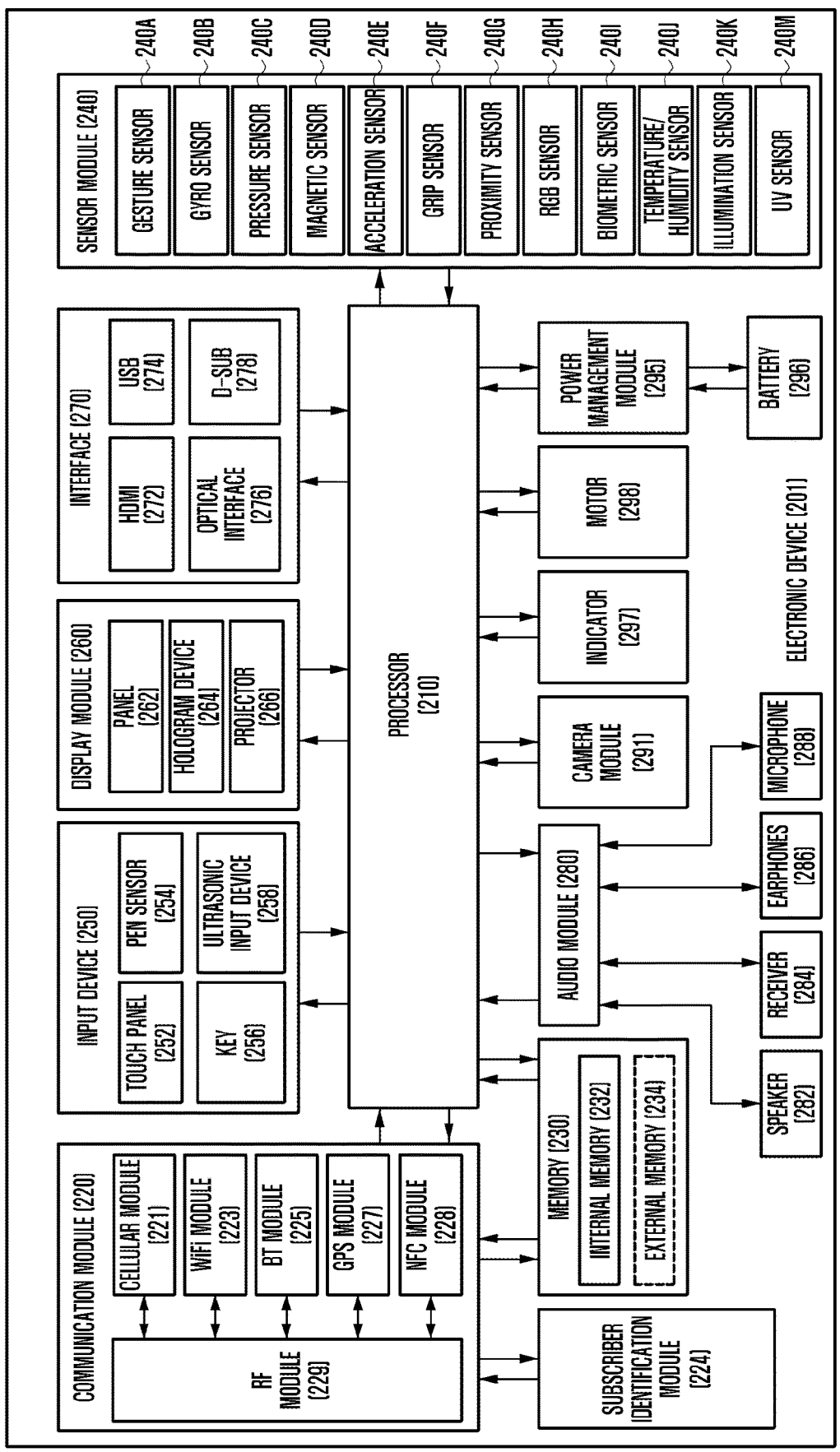
FIG. 2 illustrates a block diagram of an electronic device according to various embodiments of the present invention.

FIG. 2 is a block diagram illustrating a configuration of an electronic device 201 according to an embodiment of the present disclosure.

The hardware may be, for example, the electronic device 101 illustrated in FIG. 1.

Referring to FIG. 2, the electronic device may include one or more processors 210, a communication module 220, a subscriber identification module (SIM) card 224, a memory 230, a sensor module 240, a input device 250, a display module 260, an interface 270, an audio module 280, a camera module 291, a power management module 295, a battery 296, an indicator 297, a motor 298 and any other similar and/or suitable components.

The application processor (AP) 210 (e.g., the processor 120) may include one or more application processors (APs), or one or more communication processors (CPs). The processor 210 may be, for example, the processor 120 illustrated in FIG. 1. The AP 210 is illustrated as being included in the processor 210 in FIG. 2, but may be included in different integrated circuit (IC) packages, respectively. According to an embodiment of the present disclosure, the AP 210 may be included in one IC package.

The AP 210 may execute an operating system (OS) or an application program, and thereby may control multiple hardware or software elements connected to the AP 210 and may perform processing of and arithmetic operations on various data including multimedia data. The AP 210 may be implemented by, for example, a system on chip (SoC). According to an embodiment of the present disclosure, the AP 210 may further include a graphical processing unit (GPU) (not illustrated).

The AP 210 may manage a data line and may convert a communication protocol in the case of communication between the electronic device (e.g., the electronic device 100) including the hardware 200 and different electronic devices connected to the electronic device through the network. The AP 210 may be implemented by, for example, a SoC. According to an embodiment of the present disclosure, the AP 210 may perform at least some of multimedia control functions. The AP 210, for example, may distinguish and authenticate a terminal in a communication network by using a subscriber identification module (e.g., the SIM card 224). Also, the AP 210 may provide the user with services, such as a voice telephony call, a video telephony call, a text message, packet data, and the like.

Further, the AP 210 may control the transmission and reception of data by the communication module 220. In FIG. 2, the elements such as the AP 210, the power management module 295, the memory 230, and the like are illustrated as elements separate from the AP 210. However, according to an embodiment of the present disclosure, the AP 210 may include at least some (e.g., the CP) of the above-described elements.

According to an embodiment of the present disclosure, the AP 210 may load, to a volatile memory, a command or data received from at least one of a non-volatile memory and other elements connected to each of the AP 210, and may process the loaded command or data. Also, the AP 210 may store, in a non-volatile memory, data received from or generated by at least one of the other elements.

The SIM card 224 may be a card implementing a subscriber identification module, and may be inserted into a slot formed in a particular portion of the electronic device 100. The SIM card 224 may include unique identification information (e.g., integrated circuit card identifier (ICCID)) or subscriber information (e.g., international mobile subscriber identity (IMSI)).

The memory 230 may include an internal memory 232 and an external memory 234. The memory 230 may be, for example, the memory 130 illustrated in FIG. 1. The internal memory 232 may include, for example, at least one of a volatile memory (e.g., a dynamic RAM (DRAM), a static RAM (SRAM), a synchronous dynamic RAM (SDRAM), etc.), and a non-volatile memory (e.g., a one time programmable ROM (OTPROM), a programmable ROM (PROM), an erasable and programmable ROM (EPROM), an electrically erasable and programmable ROM (EEPROM), a mask ROM, a flash ROM, a Not AND (NAND) flash memory, a Not OR (NOR) flash memory, etc.). According to an embodiment of the present disclosure, the internal memory 232 may be in the form of a solid state drive (SSD). The external memory 234 may further include a flash drive, for example, a compact flash (CF), a secure digital (SD), a micro-secure digital (Micro-SD), a mini-secure digital (Mini-SD), an extreme digital (xD), a memory stick, or the like.

The communication module 220 may include a cellular module 221, a wireless communication module 223 or a radio frequency (RF) module 229. The communication module 220 may be, for example, the communication interface 170 illustrated in FIG. 1. The communication module 220 may include, for example, a Wi-Fi part 223, a BT part 225, a GPS part 227, or a NFC part 228. For example, the wireless communication module 220 may provide a wireless communication function by using a radio frequency. Additionally or alternatively, the wireless communication module 220 may include a network interface (e.g., a LAN card), a modulator/demodulator (modem), or the like for connecting the hardware 200 to a network (e.g., the Internet, a LAN, a WAN, a telecommunication network, a cellular network, a satellite network, a POTS, or the like).

The RF module 229 may be used for transmission and reception of data, for example, transmission and reception of RF signals or called electronic signals. Although not illustrated, the RF unit 229 may include, for example, a transceiver, a power amplifier module (PAM), a frequency filter, a low noise amplifier (LNA), or the like. Also, the RF module 229 may further include a component for transmitting and receiving electromagnetic waves in a free space in a wireless communication, for example, a conductor, a conductive wire, or the like.

The sensor module 240 may include, for example, at least one of a gesture sensor 240A, a gyro sensor 240B, an barometer sensor 240C, a magnetic sensor 240D, an acceleration sensor 240E, a grip sensor 240F, a proximity sensor 240G, a red, green and blue (RGB) sensor 240H, a biometric sensor 240I, a temperature/humidity sensor 240J, an illuminance sensor 240K, and a ultra violet (UV) sensor 240M. The sensor module 240 may measure a physical quantity or may sense an operating state of the electronic device 100, and may convert the measured or sensed information to an electrical signal. Additionally/alternatively, the sensor module 240 may include, for example, an E-nose sensor (not illustrated), an electromyography (EMG) sensor (not illustrated), an electroencephalogram (EEG) sensor (not illustrated), an electrocardiogram (ECG) sensor (not illustrated), a fingerprint sensor (not illustrated), and the like. Additionally or alternatively, the sensor module 240 may include, for example, an E-nose sensor (not illustrated), an EMG sensor (not illustrated), an EEG sensor (not illustrated), an ECG sensor (not illustrated), a fingerprint sensor, and the like. The sensor module 240 may further include a control circuit (not illustrated) for controlling one or more sensors included therein.

The input device 250 may include a touch panel 252, a pen sensor 254 (e.g., a digital pen sensor), keys 256, and an ultrasonic input unit 258. The input device 250 may be, for example, the user input module 150 illustrated in FIG. 1. The touch panel 252 may recognize a touch input in at least one of, for example, a capacitive scheme, a resistive scheme, an infrared scheme, and an acoustic wave scheme. Also, the touch panel 252 may further include a controller (not illustrated). In the capacitive type, the touch panel 252 is capable of recognizing proximity as well as a direct touch.

The touch panel 252 may further include a tactile layer (not illustrated). In this event, the touch panel 252 may provide a tactile response to the user.

The pen sensor 254 (e.g., a digital pen sensor), for example, may be implemented by using a method identical or similar to a method of receiving a touch input from the user, or by using a separate sheet for recognition. For example, a key pad or a touch key may be used as the keys 256. The ultrasonic input unit 258 enables the terminal to sense a sound wave by using a microphone (e.g., a microphone 288) of the terminal through a pen generating an ultrasonic signal, and to identify data. The ultrasonic input unit 258 is capable of wireless recognition. According to an embodiment of the present disclosure, the hardware may receive a user input from an external device (e.g., a network, a computer, or a server), which is connected to the communication module 220, through the communication module 220.

The display module 260 may include a panel 262, a hologram 264, or projector 266. The display module 260 may be, for example, the display module 160 illustrated in FIG. 1. The panel 262 may be, for example, a liquid crystal display (LCD) and an active matrix organic light emitting diode (AM-OLED) display, and the like. The panel 262 may be implemented so as to be, for example, flexible, transparent, or wearable. The panel 262 may include the touch panel 252 and one module. The hologram 264 may display a three-dimensional image in the air by using interference of light. According to an embodiment of the present disclosure, the display module 260 may further include a control circuit for controlling the panel 262 or the hologram 264.

The interface 270 may include, for example, a high-definition multimedia interface (HDMI) 272, a universal serial bus (USB) 274, an optical interface 276, and a D-subminiature (D-sub) 278. Additionally or alternatively, the interface 270 may include, for example, SD/multi-media card (MMC) (not illustrated) or infrared data association (IrDA) (not illustrated).

The audio codec 280 may bidirectionally convert between a voice and an electrical signal. The audio codec 280 may convert voice information, which is input to or output from the audio codec 280, through, for example, a speaker 282, a receiver 284, an earphone 286, the microphone 288 or the like.

The camera module 291 may capture an image and a moving image. According to an embodiment, the camera module 291 may include one or more image sensors (e.g., a front lens or a back lens), an image signal processor (ISP) (not illustrated), and a flash LED (not illustrated).

The power management module 295 may manage power of the hardware 200. Although not illustrated, the power management module 295 may include, for example, a power management integrated circuit (PMIC), a charger integrated circuit (IC), or a battery fuel gauge.

The PMIC may be mounted to, for example, an IC or a SoC semiconductor. Charging methods may be classified into a wired charging method and a wireless charging method. The charger IC may charge a battery, and may prevent an overvoltage or an overcurrent from a charger to the battery. According to an embodiment of the present disclosure, the charger IC may include a charger IC for at least one of the wired charging method and the wireless charging method. Examples of the wireless charging method may include a magnetic resonance method, a magnetic induction method, an electromagnetic method, and the like. Additional circuits (e.g., a coil loop, a resonance circuit, a rectifier, etc.) for wireless charging may be added in order to perform the wireless charging.

The battery fuel gauge may measure, for example, a residual quantity of the battery 296, or a voltage, a current or a temperature during the charging. The battery 296 may supply power by generating electricity, and may be, for example, a rechargeable battery.

The indicator 297 may indicate particular states of the hardware 200 or a part (e.g., the AP 211) of the hardware 200, for example, a booting state, a message state, a charging state and the like. The motor 298 may convert an electrical signal into a mechanical vibration. The processor 210 may control the sensor module 240.

Although not illustrated, the hardware 200 may include a processing unit (e.g., a GPU) for supporting a module TV. The processing unit for supporting a module TV may process media data according to standards such as, for example, digital multimedia broadcasting (DMB), digital video broadcasting (DVB), media flow, and the like. Each of the above-described elements of the hardware 200 according to an embodiment of the present disclosure may include one or more components, and the name of the relevant element may change depending on the type of electronic device. The hardware according to an embodiment of the present disclosure may include at least one of the above-described elements. Some of the above-described elements may be omitted from the hardware, or the hardware may further include additional elements. Also, some of the elements of the hardware according to an embodiment of the present disclosure may be combined into one entity, which may perform functions identical to those of the relevant elements before the combination.

The term "module" used in the present disclosure may refer to, for example, a unit including one or more combinations of hardware, software, and firmware. The "module" may be interchangeable with a term, such as "unit," "logic," "logical block," "component," "circuit," or the like. The "module" may be a minimum unit of a component formed as one body or a part thereof. The "module" may be a minimum unit for performing one or more functions or a part thereof. The "module" may be implemented mechanically or electronically. For example, the "module" according to an embodiment of the present disclosure may include at least one of an application-specific integrated circuit (ASIC) chip, a field-programmable gate array (FPGA), and a programmable-logic device for performing certain operations that have been known or are to be developed in the future.

Figure 3:
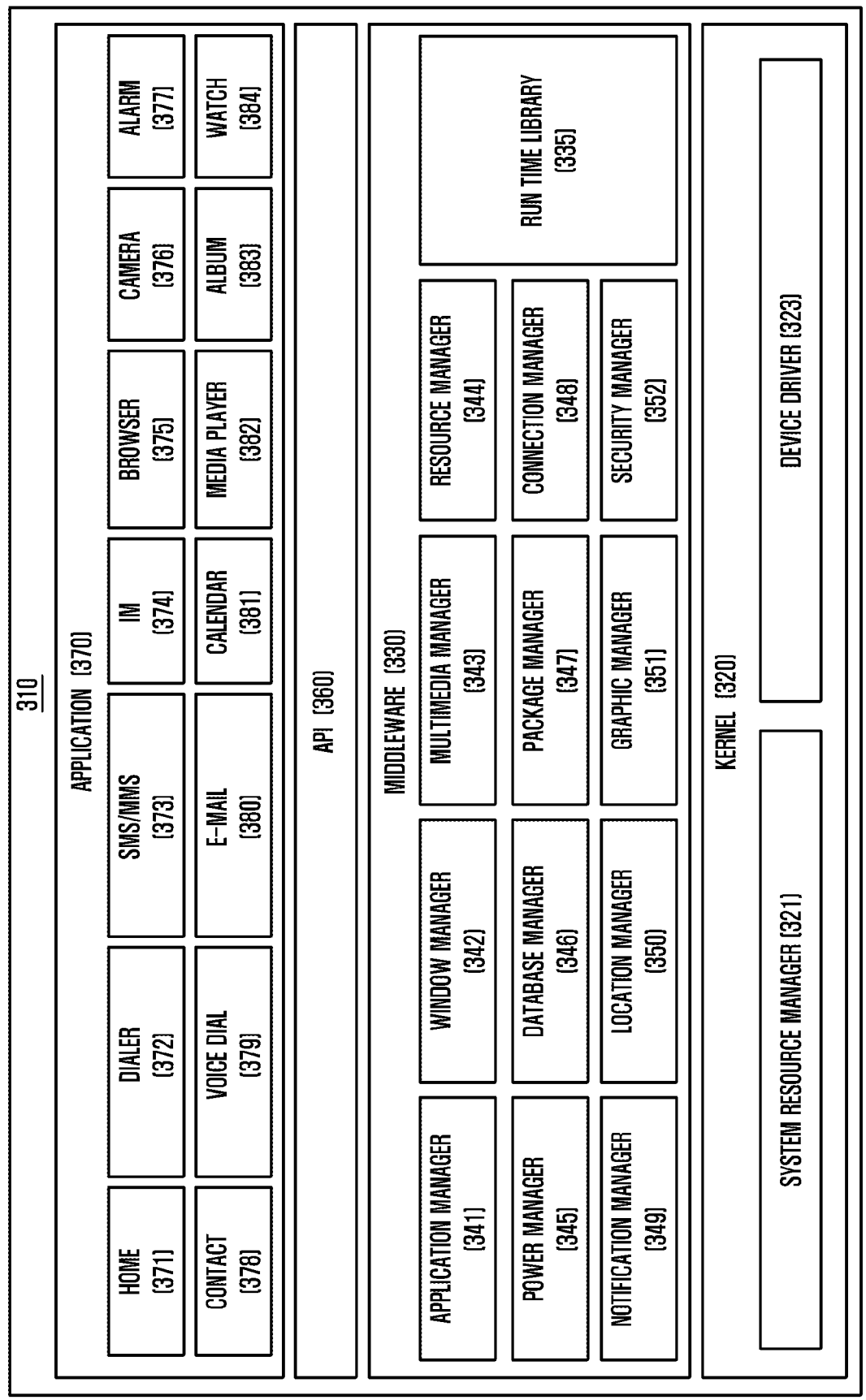
FIG. 3 illustrates a block diagram of a program module according to various embodiments of the present invention.

FIG. 3 is a block diagram illustrating a configuration of a programming module 310 according to an embodiment of the present disclosure.

The programming module 310 may be included (or stored) in the electronic device 100 (e.g., the memory 130) or may be included (or stored) in the electronic device 201 (e.g., the memory 230) illustrated in FIG. 1. At least a part of the programming module 310 may be implemented in software, firmware, hardware, or a combination of two or more thereof. The programming module 310 may be implemented in hardware (e.g., the hardware 200), and may include an OS controlling resources related to an electronic device (e.g., the electronic device 100) and/or various applications (e.g., an application 370) executed in the OS. For example, the OS may be ANDROID, iOS, WINDOWS, SYMBIAN, TIZEN, BADA, and the like.

Referring to FIG. 3, the programming module 310 may include a kernel 320, a middleware 330, an API 360, and/or the application 370.

The kernel 320 (e.g., the kernel 141) may include a system resource manager 321 and/or a device driver 323. The system resource manager 321 may include, for example, a process manager (not illustrated), a memory manager (not illustrated), and a file system manager (not illustrated). The system resource manager 321 may perform the control, allocation, recovery, and/or the like of system resources. The device driver 323 may include, for example, a display driver (not illustrated), a camera driver (not illustrated), a BLUETOOTH driver (not illustrated), a shared memory driver (not illustrated), a USB driver (not illustrated), a keypad driver (not illustrated), a Wi-Fi driver (not illustrated), and/or an audio driver (not illustrated). Also, according to an embodiment of the present disclosure, the device driver 323 may include an inter-process communication (IPC) driver (not illustrated).

The middleware 330 may include multiple modules previously implemented so as to provide a function used in common by the applications 370. Also, the middleware 330 may provide a function to the applications 370 through the API 360 in order to enable the applications 370 to efficiently use limited system resources within the electronic device. For example, as illustrated in FIG. 3, the middleware 330 (e.g., the middleware 143) may include at least one of a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, a security manager 352, and any other suitable and/or similar manager.

The runtime library 335 may include, for example, a library module used by a compiler, in order to add a new function by using a programming language during the execution of the application 370. According to an embodiment of the present disclosure, the runtime library 335 may perform functions that are related to input and output, the management of a memory, an arithmetic function, and/or the like.

The application manager 341 may manage, for example, a life cycle of at least one of the applications 370. The window manager 342 may manage GUI resources used on the screen. The multimedia manager 343 may detect a format used to reproduce various media files and may encode or decode a media file through a codec appropriate for the relevant format. The resource manager 344 may manage resources, such as a source code, a memory, a storage space, and/or the like of at least one of the applications 370.

The power manager 345 may operate together with a basic input/output system (BIOS), may manage a battery or power, and may provide power information and the like used for an operation. The database manager 346 may manage a database in such a manner as to enable the generation, search and/or change of the database to be used by at least one of the applications 370. The package manager 347 may manage the installation and/or update of an application distributed in the form of a package file.

The connectivity manager 348 may manage a wireless connectivity such as, for example, Wi-Fi and Bluetooth. The notification manager 349 may display or report, to the user, an event such as an arrival message, an appointment, a proximity alarm, and the like in such a manner as not to disturb the user. The location manager 350 may manage location information of the electronic device. The graphic manager 351 may manage a graphic effect, which is to be provided to the user, and/or a user interface related to the graphic effect. The security manager 352 may provide various security functions used for system security, user authentication, and the like. According to an embodiment of the present disclosure, when the electronic device (e.g., the electronic device 100) has a telephone function, the middleware 330 may further include a telephony manager (not illustrated) for managing a voice telephony call function and/or a video telephony call function of the electronic device.

The middleware 330 may generate and use a new middleware module through various functional combinations of the above-described internal element modules. The middleware 330 may provide modules specialized according to types of OSs in order to provide differentiated functions. Also, the middleware 330 may dynamically delete some of the existing elements, or may add new elements. Accordingly, the middleware 330 may omit some of the elements described in the various embodiments of the present disclosure, may further include other elements, or may replace the some of the elements with elements, each of which performs a similar function and has a different name.

The API 360 (e.g., the API 145) is a set of API programming functions, and may be provided with a different configuration according to an OS. In the case of Android or iOS, for example, one API set may be provided to each platform. In the case of TIZEN, for example, two or more API sets may be provided to each platform.

The applications 370 (e.g., the applications 147) may include, for example, a preloaded application and/or a third party application. The applications 370 (e.g., the applications 147) may include, for example, a home application 371, a dialer application 372, a short message service (SMS)/multimedia message service (MMS) application 373, an instant message (IM) application 374, a browser application 375, a camera application 376, an alarm application 377, a contact application 378, a voice dial application 379, an electronic mail (e-mail) application 380, a calendar application 381, a media player application 382, an album application 383, a clock application 384, and any other suitable and/or similar application.

At least a part of the programming module 310 may be implemented by instructions stored in a non-transitory computer-readable storage medium. When the instructions are executed by one or more processors (e.g., the one or more processors 210), the one or more processors may perform functions corresponding to the instructions. The non-transitory computer-readable storage medium may be, for example, the memory 230. At least a part of the programming module 310 may be implemented (e.g., executed) by, for example, the one or more processors 210. At least a part of the programming module 310 may include, for example, a module, a program, a routine, a set of instructions, and/or a process for performing one or more functions.

Names of the elements of the programming module (e.g., the programming module 310) according to an embodiment of the present disclosure may change depending on the type of OS. The programming module according to an embodiment of the present disclosure may include one or more of the above-described elements. Alternatively, some of the above-described elements may be omitted from the programming module. Alternatively, the programming module may further include additional elements. The operations performed by the programming module or other elements according to an embodiment of the present disclosure may be processed in a sequential method, a parallel method, a repetitive method, or a heuristic method. Also, some of the operations may be omitted, or other operations may be added to the operations.

In various embodiments of the present disclosure, an electronic device is implemented in such a way as to include: a housing including a first side facing a first direction, a second side facing a second direction opposite the first direction, and sides each of which partially encloses both edges of the first and second sides; a display including a first image-display area on the first side, a second image-display area on the second side, and third image-display areas on the sides; a communication circuit configured to perform wireless communication with an external device; a processor that is located in the housing and is electrically connected to the display and the communication circuit; and a memory that is located in the housing, is electrically connected to the processor, and stores a first application with a first user interface, a second application with a second user interface, and instructions. The instructions enable the processor to: display the first user interface on the first image-display area; display text or icons related to the second application on the third image-display area; receive a first user input for selecting an item or action via the first image-display area; receive, when the first user input is received, a second user input for selecting the text or the icon via the third image display area; and display the second user interface on the second image-display area, in response to the second user input, and process the item or action, using the second application. The first application includes a photo gallery application. The second application includes at least one message/email sending application. At least one of the third image-display areas extends from the edge of the first image-display area to the edge of the second image-display area. At least one of the sides is formed to be curved. The third image-display area is formed on at least one of the sides. The second user input includes: a user action for dragging an object located in the first image-display area to the text or the icons located in the second image-display area. The second user input includes: a user action for dragging the text or the icons located in the second image-display area to an object located in the first image-display area. The instructions enable the processor to perform, when executing the second application, linkify to link an object located in the first image-display area with the second image-display area running the second application. The instructions enable the processor to: switch a first screen displayed on the first image-display area to a second screen in response to a third user input; and display the first screen on the second image-display area, when switching the first screen to the second screen on the first image-display area. The instructions enable the processor to allow the first and second image-display areas to display: screens on which the same application is running; and the same information included in the execution screens in different forms, respectively. The instructions enable the processor to allow the first and second image-display areas to display screens on which the same application is running, wherein information of the execution screen shown on the first image-display area is shown on the second image-display area. The instructions enable the processor to: execute a third application in response to a user input; and allow the first to third image-display areas to display corresponding partial screens of a single screen, respectively, and display the single screen formed as the partial screens shown on the first to third image-display areas are successively connected to each other. The third application includes a map search application and/or a photo gallery application.

In the following description, electronic devices according to various embodiments of the present disclosure are explained in detail.

Figure 4:
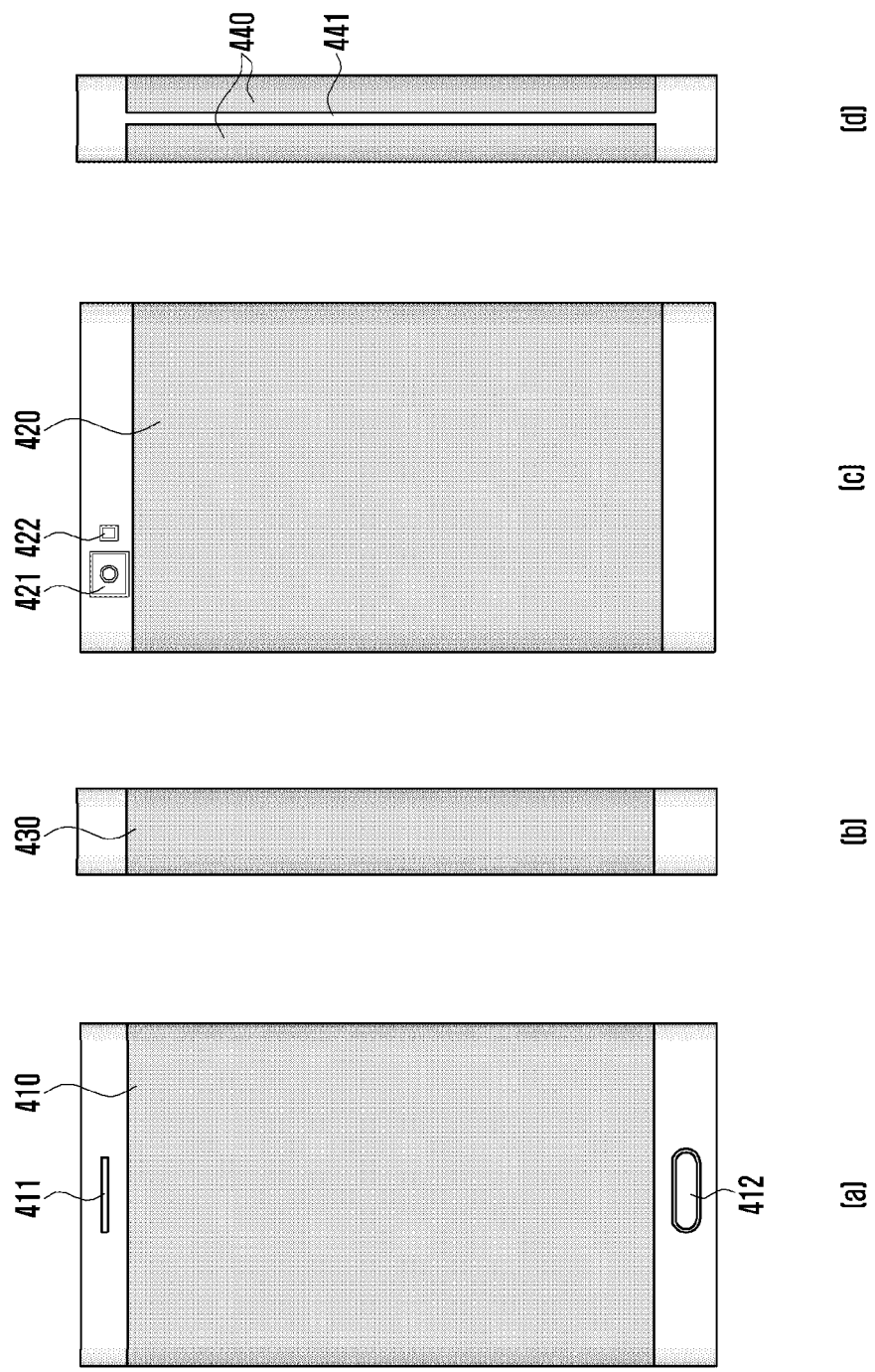
FIG. 4 illustrates diagrams of the outward appearance of an electronic device according to various embodiments of the present invention.

FIG. 4 shows diagrams of the outward appearance of an electronic device according to various embodiments of the present invention.

With reference to FIG. 4, an electronic device according to an embodiment may be a multiple display device with a number of display areas. The electronic device is capable of including: a display 410 on the front side (e.g., first side), a display 420 on the rear side (e.g., second side), and display 430 and 440 on sides (e.g., third sides). More specifically, as shown in diagram (a) of FIG. 4, the first display 410 facing a first direction is mounted on the front side of the electronic device. In an embodiment, the electronic device may be a smartphone with a call function. In this case, the electronic device may include a speaker 411 at the top above the first display 410 and at least one user operation button 412 at the bottom below the first display 410. As shown in diagram (c) of FIG. 4, the second display 420 facing a second direction is mounted on the rear side of the electronic device. The second direction is opposite the first direction. The electronic device may include a camera 421 and a flash 422 for taking images at the top above the second display 420. With reference to diagrams (b) and (d) of FIG. 4, the electronic device includes a third display 430 and fourth display 440 at both sides, respectively. The third and fourth displays 430 and 440 may be extended from the first display 410 or the second display 420. For example, the first to fourth display 410, 420, 430, and 440 may be continuously connected to each other. In an embodiment, as shown in diagram (d) of FIG. 4, the first to fourth display 410, 420, 430, and 440 are continuously connected to each other, and the fourth display 440 is divided into two in the lengthwise direction of the electronic device. For example, the electronic device includes a partition (bezel) 441 in one of both sides of the housing where the fourth display 440 is located. The bezel 441 divides the fourth display 440 into two fourth displays in the lengthwise direction of the electronic device, one of which is connected to the first display 410 and the other of which is connected to the second display 420. The bezel 441 of the housing may include at least one user operation button.

Figure 5:
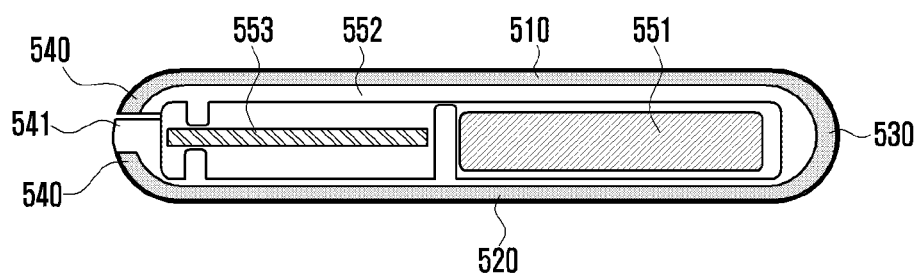
FIG. 5 illustrates a cross-sectional view of an electronic device according to various embodiments of the present invention.

FIG. 5 is a cross-sectional view of an electronic device according to various embodiments of the present invention. FIG. 5 is a cross-sectional view of an electronic device shown in FIG. 4.

As shown in FIG. 5, the electronic device may be protected by a hosing 552 as a casing member. The housing 552 encases parts of the electronic device therein. For example, the housing 552 is configured to form a hollow space receiving an operation circuit, a power circuit, a communication circuit, a battery 551, etc., related to the operations of the electronic device. The operation circuit and the power circuit may be implemented on a printed circuit board (PCB) 553. The outer surface of the housing 552 includes: a first side that faces a first direction and is covered by a first display 510; a second side that faces a second direction and is covered by a second display 520; sides each of which encloses parts between the first and second sides and each of which are covered by third and fourth displays 530 and 540, respectively. The first to fourth display 510, 520, 530, and 540 of the outer surface of the housing 552 may be continuously connected to each other. Therefore, the electronic device includes the first image-display area on the first side, the second image-display area on the second side, and the third image-display areas on the sides. The housing 552 includes a bezel 541, on the side covered by the fourth display 540, for dividing the fourth display 540 into two parts.

Figure 6A:
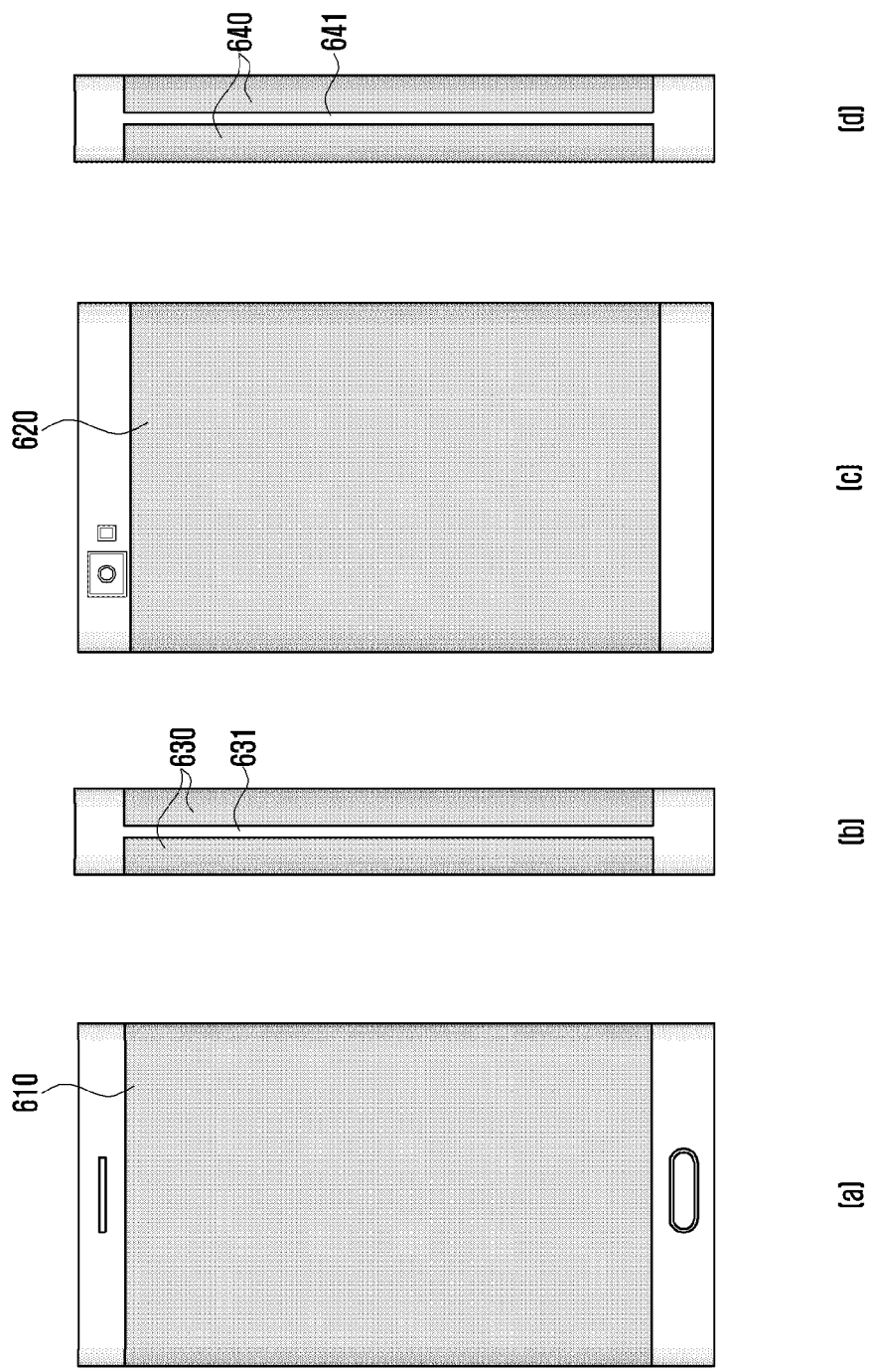
Figure 6B:
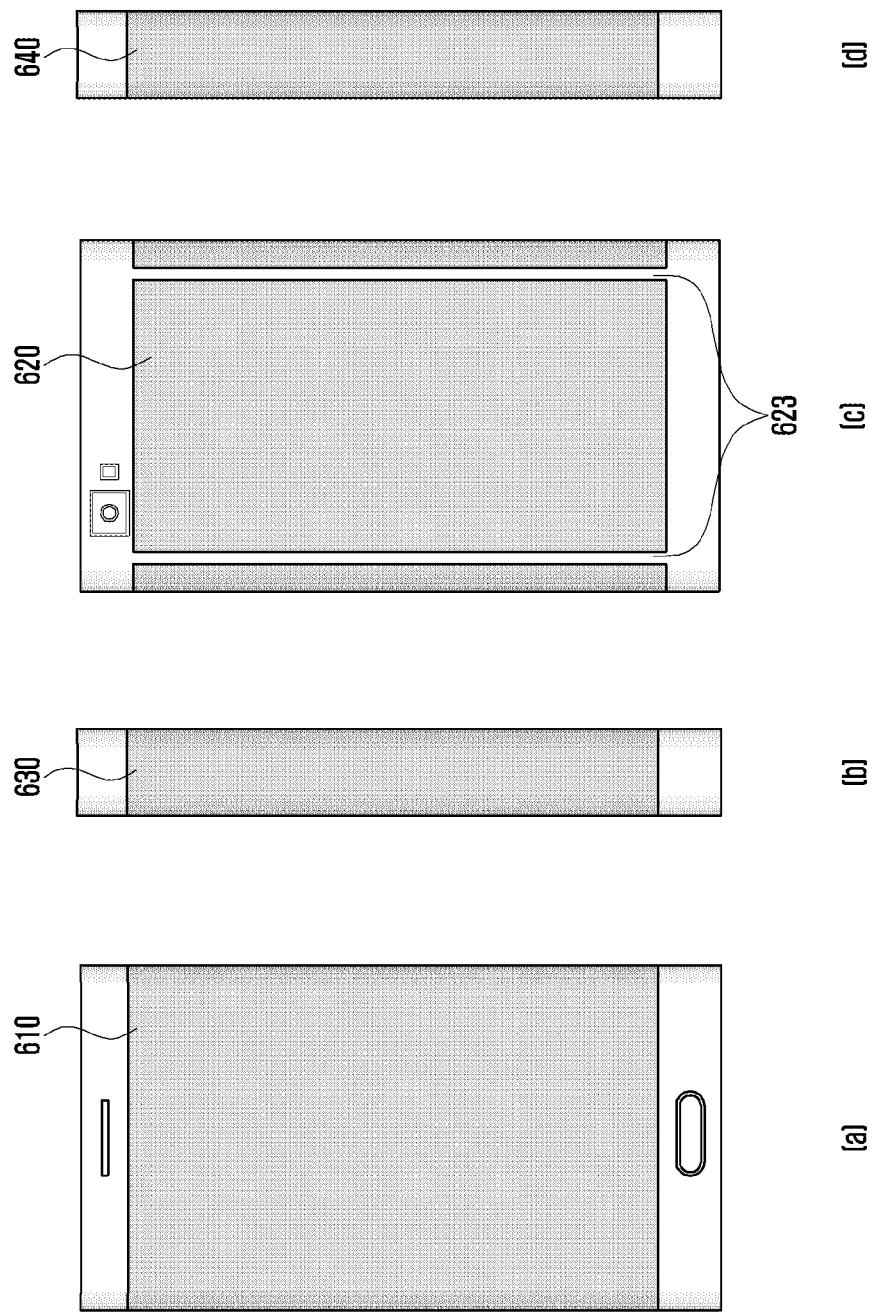

FIGS. 6A to 6C show diagrams of the outward appearance of an electronic device according to various embodiments of the present invention.

With reference to FIGS. 6A to 6C, an electronic device according to various embodiments may be equipped with a multiple display device with a number of display areas. The electronic device of FIGS. 6A to 6C may be modified, in external appearance, from the electronic device shown in FIG. 4.

With reference to FIG. 6A, an electronic device according to an embodiment is capable of including third and fourth displays 630 and 640 on both sides, each of which is formed to be divided into two parts. As shown in diagram (b) of FIG. 6A, the electronic device is capable of including the third display 630 on one side. The third display 630 may be formed in such a way that the first and second displays 610 and 620 extend to one side, respectively. The third display 630 is split into two parts by a first bezel 631 in the lengthwise direction. As shown in diagram (d) of FIG. 6A, the electronic device is capable of including the fourth display 640 on the other side. The fourth display 640 may be formed in such a way that the first and second displays 610 and 620 extend to the other side, respectively. The fourth display 640 is split into two parts by a second bezel 641 in the lengthwise direction.

With reference to FIG. 6B, an electronic device according to an embodiment is capable of including a second display 620 on the rear side. As shown in diagram (c) of FIG. 6B, bezels 623 are located at both edges of the second display 620. In the rear size of the electronic device, a first bezel is located between the second and third displays and a second bezel is located between the second and fourth displays. As shown in FIG. 6B, the electronic device includes a first display 610 on the front side and third and fourth displays 630 and 640 on the sides. The first, third and fourth displays 610, 630 and 640 are successively connected to each other.

With reference to FIG. 6C, an electronic device according to an embodiment includes displays on a front side, a rear side, and one of the sides. For example, the electronic device includes: a first display 610 on the front side and a second display 620 on the rear side as shown in FIG. 6C; and a third display 630 on one of both sides as shown in diagram (b) of FIG. 6C. In this case, as shown in diagram (d) of FIG. 6C, the electronic device may not include a display on the other side 650 of both sides.

Figure 7:
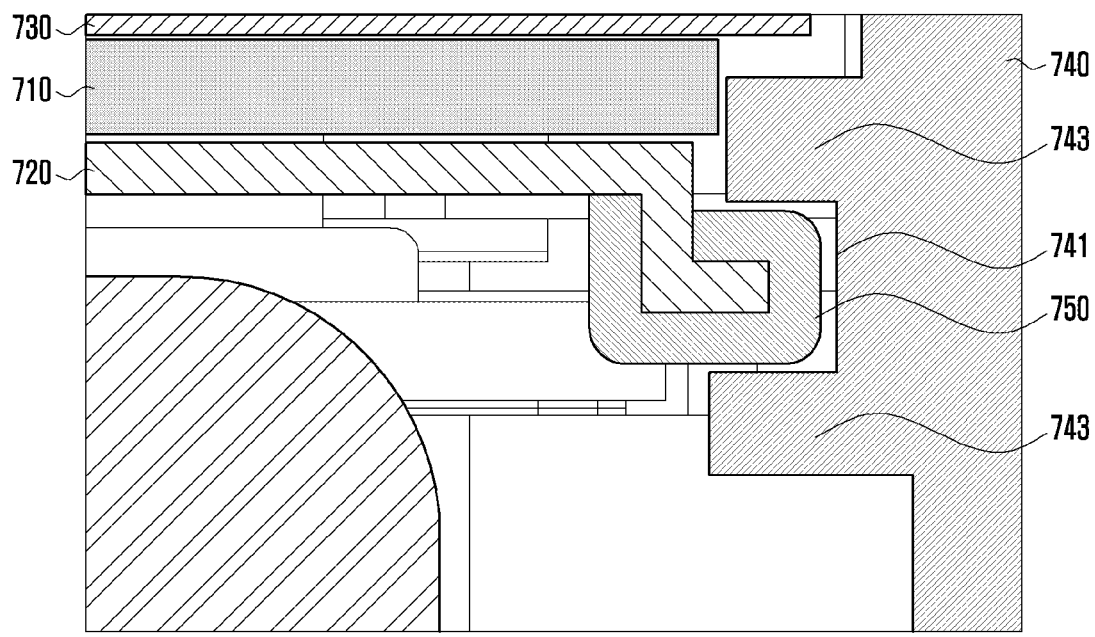
FIG. 7 illustrates a detailed cross-sectional view of an electronic device according to various embodiments of the present invention.

FIG. 7 is a detailed cross-sectional view of an electronic device according to various embodiments of the present disclosure.

With reference to FIG. 7, an electronic device according to an embodiment is capable of including a housing. The housing is capable of including a number of mechanical components for receiving and loading a number of parts configuring the electronic device. For example, the housing is capable of including a cover glass 730, middle frames 720, side frames 740, and rail members 750. The cover glass 730 covers the outer surface of the display 710. The cover glass 730 protects the display 710 against damage. The middle frame 720 supports the display 710 from the back. The side frames 740 enclose the cover glass 730, the display 710, and the middle frame 720 from the sides. The rail member 750 is located at a groove 741 between the middle frame 720 and the side frame 740, and includes a rail into which the end of the middle frame 720 is fitted. For example, the side frame 740 includes a number of protrusions 743 forming steps protruded in the inner direction where the display 710 is received and located. The rail member 750 is placed in a space formed by the side frame 740 and the two adjacent protrusions 743. The rail member 750 includes a rail formed in such a way as to: slidably receive one end of a bent part of the middle frame 720; and enclose the bent part. The bent part of the middle frame 720 is a part (parts) at one or more side ends of the middle frame 720, which is (are) slidably coupled to the rail member 750 and fitted into the groove 741 of the side frame 740. The bent part of the middle frame 720 is designed in such a way that the end of the middle frame 720 is bent at least two times and forms a step at the end of the flat part supporting the display 710. It should be understood that the bent part may be implemented in various forms. Since the electronic device according to an embodiment includes the rail member 750 into which the bent part of the middle frame 720 is slidably fitted from the end, it can be easily assembled, and this leads to increase the productivity and yield.

Figure 8:
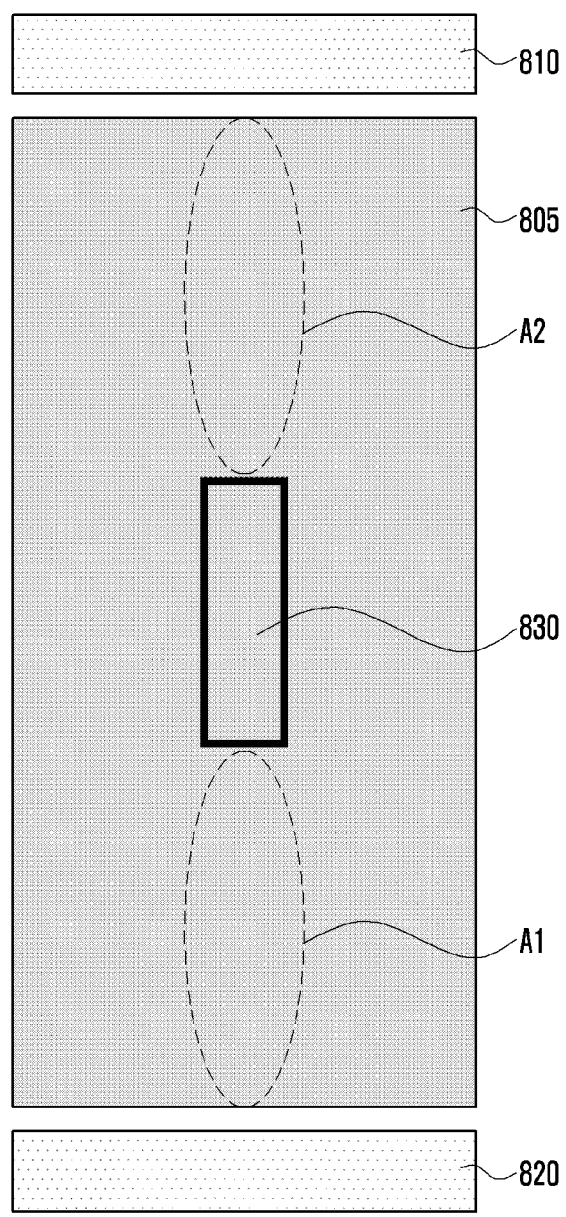
FIG. 8 illustrates a diagram showing the configuration of an electronic device according to various embodiments of the present invention.

FIG. 8 is a diagram showing the configuration of an electronic device according to various embodiments of the present disclosure. More specifically, FIG. 8 is a side view of an electronic device.

With reference to FIG. 8, an electronic device according to an embodiment is capable of including at least one hole (obstacle) 830 inside an image-display area of a display 805. The hole 830 may be an obstacle to dispose a user input button. For example, an electronic device according to an embodiment may be designed in such a way that a display 805 is disposed on at least one side and a user input button is formed on the side where the display 805 is disposed. The user input button may be disposed in the hole 830 formed inside the image-display area of the display 805.

When the hole 830 is formed inside the image-display area of the display 805, it is difficult to drive the image-display area located at one or the other side with respect to the hole 830. For example, the electronic device is designed in such a way that: a display 805 with a hole 830 is located at one side (front/rear) of the electronic device and an operation circuit 820 for driving the display 805 is located at the bottom (or top) of the display 805. The display 805 includes a number of signal lines in a matrix form for providing video data output from the operation circuit 820 to a number of pixels. In this case, part of the signal lines, between the hole 830 and the operation circuit 820, do not maintain the linearity, which is because the hole 830 serves as an obstacle. For example, if the operation circuit 820 is located at the bottom of the display 805 and the hole 830 is inside the image-display area of the display 805, the display 805 may show a video on a first region A1 where the hole 830 and the operation circuit 820 face each other on the strait line between the hole 830 and the operation circuit 820 because the linearity of the signal lines is maintained; however, the display 805 may not show a video on a second region A2 that corresponds to the other region, except for the first region A1, because the linearity of the signal lines is not maintained by the hole 830. The first region A1 is referred to as a region that is located between the top end of the display 805 and the hole 830 on the straight line in which the hole 830 and the operation circuit 820 face each other. If the operation circuit 820 is located at the top of the display 805, the first region A1 and the second region A2 may change their locations with each other.

The electronic device according to an embodiment may be implemented in such a way that operation circuits are installed to both of the top and bottom of the display 805 and take charge of the display on the first and second regions A1 and A2, respectively. For example, the electronic device includes: a first operation circuit 820 at the bottom of the display 805 so that the first operation circuit 820 can drive an image-display area corresponding to the first region A1; and a second operation circuit 810 at the top of the display 805 so that the second operation circuit 810 can drive an image-display area corresponding to the second region A2. The electronic device may allow one of the first and second operation circuits 810 and 820 to drive an image-display area corresponding to the remaining region, except for the first and second regions A1 and A2. Since the electronic device according to an embodiment is implemented to include operation circuits 810 and 820 for operation the display 805 at the top and bottom of the display 805 respectively, although a hole 830 is formed inside an image-display area of the display 805, the electronic device is capable of displaying a video on all the region except for the hole 830.

Figure 9:
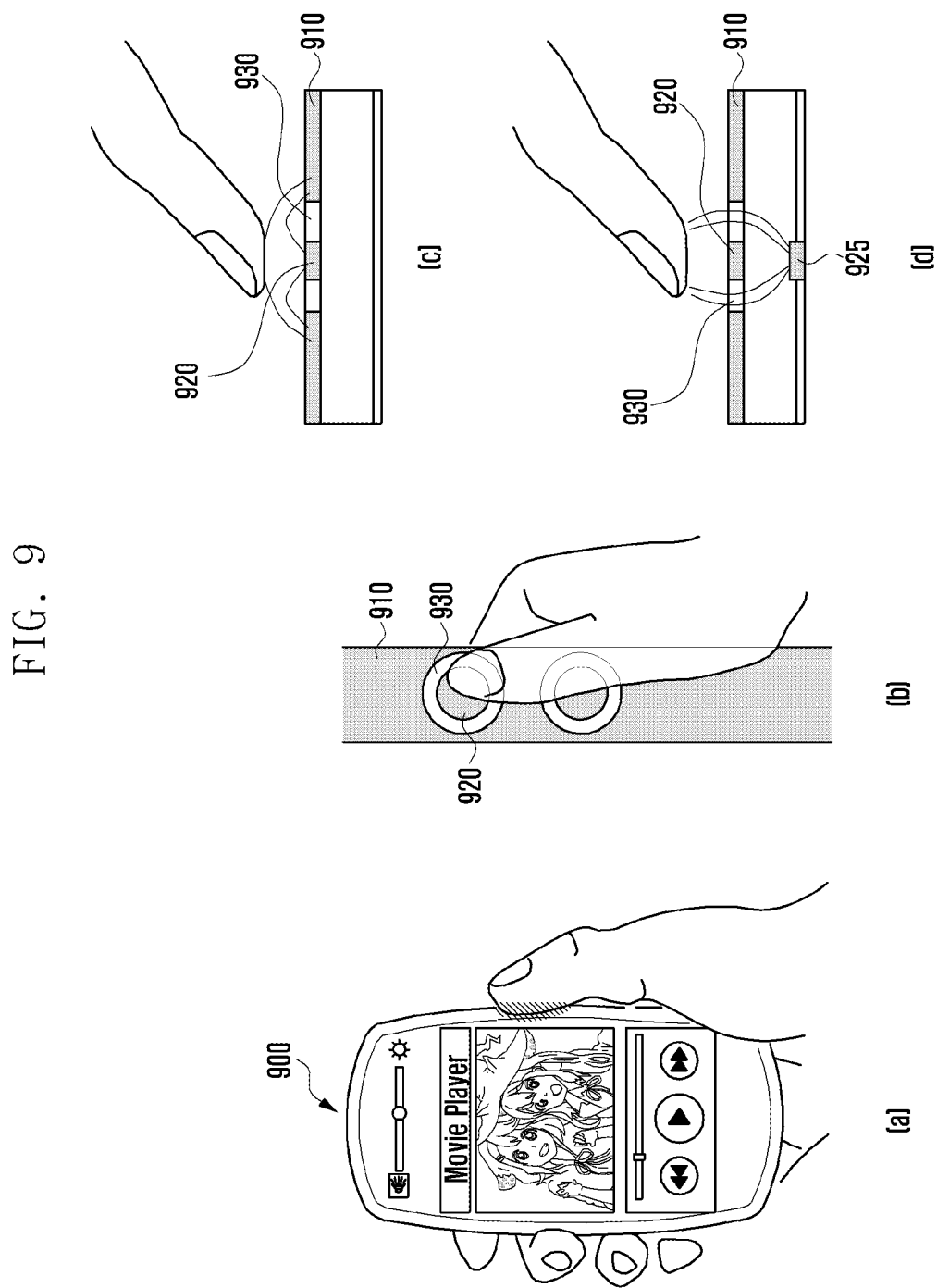
FIG. 9 illustrates diagrams that describe a metal key of an electronic device according to various embodiments of the present invention.
Figure 10:
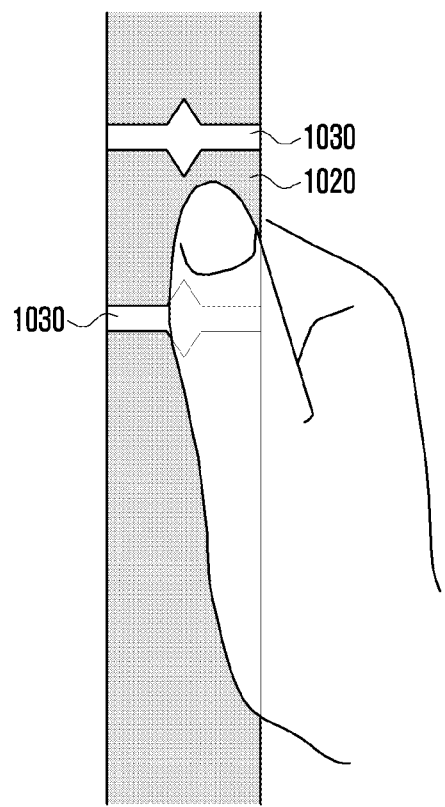
FIG. 10 illustrates a detailed diagram of a metal key of an electronic device according to various embodiments of the present invention.

FIG. 9 shows diagrams that describe a metal key of an electronic device according to various embodiments of the present disclosure. FIG. 10 is a detailed diagram of a metal key of an electronic device according to various embodiments of the present disclosure.

With reference to FIG. 9, an electronic device 900 according to an embodiment may be designed in such a way that a user operation button (user operation buttons) is (are) included in at least one side of the housing. The housing of the electronic device 900 may be made of a metal material. The user operation button may be formed as a non-protrusion structure. As shown in diagrams (a) to (b) of FIG. 9, the electronic device 900 includes a bezel 910 in at least one of the sides of the housing, for dividing the display extended, in the side direction, from an edge of the front side or rear side, into two displays in the lengthwise of the display. The bezel 910 may be made of a metal material. The bezel 910 includes at least one user operation button. The user operation button may be formed in non-protrusion structure. As shown in diagram (b) of FIG. 9, the user operation button may be implemented to include: an insulator 930 formed in part of the bezel 910; and a metal key 920 that is formed inside the insulator 930 and spaced apart from the metal material of the bezel 910. The insulator 930 may be shaped in circle or polygon. Part of the margin of the bezel 910 may be formed at both sides of the insulator 930. Therefore, the bezel 910 may have a non-division form in a region where the user operation button is located. The user operation button detects a user input via mutual capacitance. To this end, the metal key 920 is designed in a single layer or double layers. As shown in diagram (c) of FIG. 9, the metal key 920 is designed in a single layer. As shown in diagram (d) of FIG. 9, the metal key 920 is designed in double layers further including a second metal key 925 that is located below the metal key 920 and overlaps the metal key 920, seen from the top.

With reference to FIG. 10, an electronic device according to another embodiment may be designed in such a way that a bezel is divided by a user operation button. The user operation button may include a number of insulators 1030 configured to divide the bezel into parts in the width direction. For example, the user operation button may include: a first insulator in a region, for dividing a bezel into two parts in the width direction; a second insulator spaced apart from the first insulator, for dividing the bezel into two parts in the width direction; and a metal key 1020 located between the first and second insulators.

In various embodiments of the present disclosure, a method of operating an electronic device is implemented to include: executing a first application, and displaying a first user interface on a first image-display area; displaying text or icons related to a second application on a third image-display area; receiving a first user input for selecting an item or action via the first image-display area; receiving, when receiving the first user input, a second user input for selecting the text or the icon via the third image-display area; and displaying the second user interface on the second image-display area, in response to the second user input, and processing the item or action, using the second application. The first application includes a photo gallery application. The second application includes at least one message/email sending application. The reception of a second user input includes: receiving a user action for dragging an object located in the first image-display area to the text or the icons located in the second image-display area. The reception of a second user input includes: receiving a user action for dragging the text or the icons located in the second image-display area to an object located in the first image-display area. The method may further include: performing, when executing the second application, linkify to link an object located in the first image-display area with the second image-display area running the second application. The method may further include: switching a first screen displayed on the first image-display area to a second screen in response to a third user input; and displaying the first screen on the second image-display area, when switching the first screen to the second screen on the first image-display area. The method may further include allowing the first and second image-display areas to display: screens on which the same application is running; and the same information included in the execution screens in different forms, respectively. The method may further include: allowing the first and second image-display areas to display screens on which the same application is running, wherein information of the execution screen shown on the first image-display area is shown on the second image-display area. The method may further include: executing a third application in response to a user input; and allowing the first to third image-display areas to display corresponding partial screens of a single screen, respectively, and displaying the single screen formed as the partial screens shown on the first to third image-display areas are successively connected to each other. The third application includes: a map search application and/or a photo gallery application.

Figure 11:
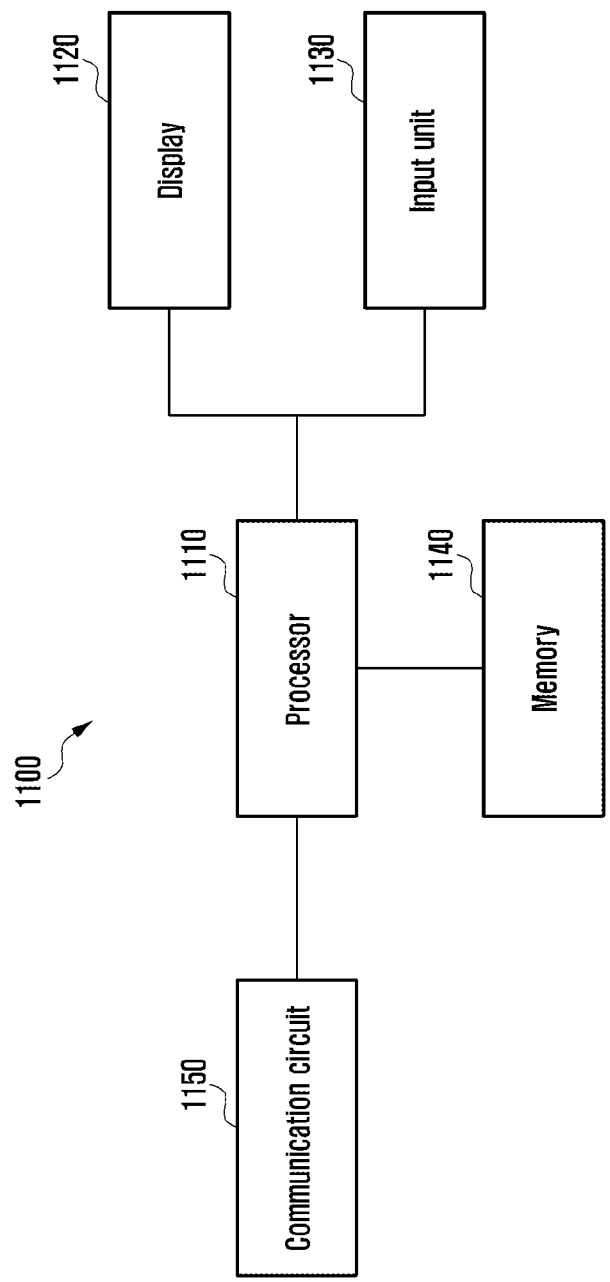
FIG. 11 illustrates a block diagram of an electronic device according to various embodiments of the present invention.

FIG. 11 is a block diagram of an electronic device according to various embodiments of the present disclosure.

With reference to FIG. 11, an electronic device according to various embodiments is capable of including a display 1120, a communication circuit 1150, an input unit 1130, a memory 1140, and a processor 1110.

The display 1120 (e.g., display 260) is capable of displaying data/information input by a user and provided to the user, as well as various menus for the electronic device 1100. For example, the display 1120 is capable of providing various types of screens according to the operations of the electronic device 1100, such as an idle screen (home screen), menu screens, a message writing screen, a call screen, schedule management screen, contacts screen, web-page output screens, etc. The display 1120 may be implemented with a liquid crystal display (LCD), organic light emitting diodes (OLEDs), active matrix organic light emitting diodes (AMOLEDs), or the like. When the display 1120 is implemented with a touch-screen, it may also serve as the input unit 1130.

In an embodiment, the display 1120 may be formed to enclose the sides of the electronic device, including a number of image-display areas corresponding to the sides. For example, the display 1120 includes: a first display on the front side (e.g., first side) of the electronic device; a second display on the rear side (e.g., second side) of the electronic device; and a third display (third displays) on a side (sides) of the electronic device. An area displaying a video via the first display is defined as a first image-display area. An area displaying a video via the second display is defined as a second image-display area. An area displaying a video via the third display is defined as a third image-display area. The first to third displays may be continuously connected to each other. For example, the third display may be formed in such a way that the first or second display extends to the side. Therefore, at least part of the third image-display area may extend from the edge of the first image-display area to the edge of the second image-display area. At least one of the sides is formed as a curve. The third image-display area may be formed in at least one of the sides.

In an embodiment, the first to third displays is capable of operating independently, respectively, under the control of the processor 1110, displaying different videos or successive parts of a video. The first to third displays may display videos in various modes according to the method of operating an electronic device, which will be described in detail later.

The communication circuit 1150 (e.g., communication module 220) establishes, with a base station, a communication cannel for a call (e.g., a voice call, a video call, etc.) and a data communication channel for the transmission of data. The communication circuit 1150 includes: an RF transmitter for up-converting the frequency of signals to be transmitted and amplifying the signals, an RF receiver for low-noise amplifying received RF signals and down-converting the frequency of the received RF signals, a transmission/reception separator for separating transmission signals and reception signals, etc.

The input unit 1130 (e.g., input unit 250) includes input keys and function keys that receive numerical or alphabetical information and set and control a variety of functions in the electronic device 1100. For example, the input unit 1130 may be implemented with one of the following: a button-type key pad, a ball joystick, an optical joystick, a wheel key, a touch key, a touch pad, a touch screen, etc., or a combination thereof.

The memory 1140 (e.g., memory 230) is capable of storing: an operating system (OS) of the electronic device 1100; applications required for option functions, e.g., an audio playback function, image/video playback function, broadcast playback function, etc.; user data, data transmitted during the communication, etc. For example, the memory 1140 is capable of storing video files, game files, music files, movie files, etc.

The processor 1110 (e.g., processor 210) controls the entire operation of the electronic device 1100 and the signals between the components in the electronic device 1100. The processor 1110 also performs a data process function. For example, the processor 1110 may be a central processing unit (CPU), a micro-processor unit (MPU), an application processor (AP), etc.

In various embodiments, the processor 1110 is capable of executing an application, providing a user interface via a display, and controlling the first to third displays to show screens in response to user inputs. The following description provides a detailed description regarding a method for a processor to control the first to third displays to show screens.

Figure 12:
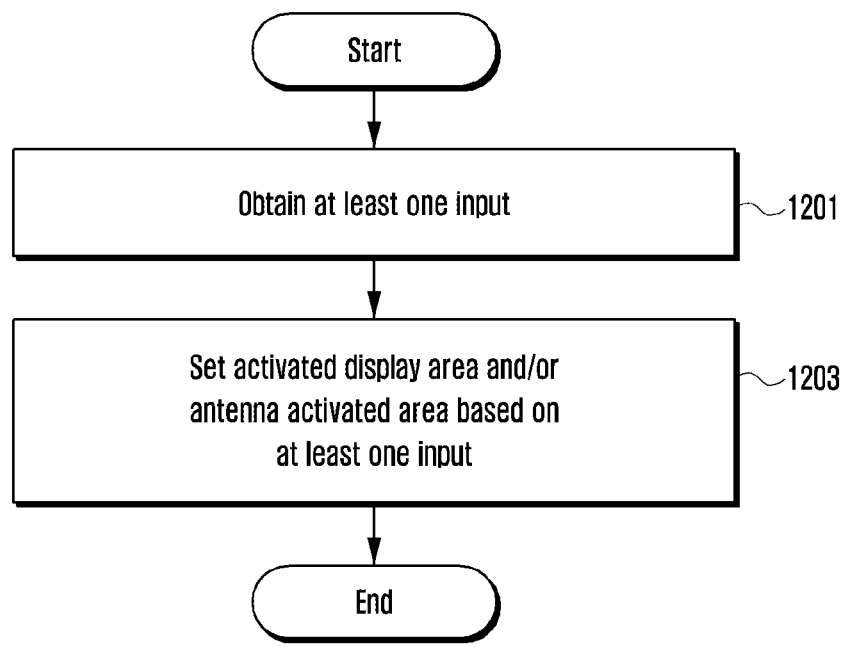
FIG. 12 illustrates a flowchart that describes operations of an electronic device according to various embodiments of the present invention.

FIG. 12 is a flowchart that describes operations of an electronic device according to various embodiments of the present disclosure.

With reference to FIG. 12, the electronic device is capable of simultaneously using activated areas of the display. Alternatively, the electronic device is also capable of controlling activated areas, independently, respectively. The processor (e.g., the application processor 210 shown in FIG. 2) is capable of detecting at least one input in operation 1201. For example, at least one input may be created by various types of input units of the electronic device (e.g., the electronic device 101 shown in FIG. 1). At least one input may be information obtained from at least one sensor (e.g., the sensor module 240 shown in FIG. 2). At least one input may be a signal received from external systems, e.g., an incoming call signal, a message reception signal, etc. At least one input may also include a start operation of a pre-defined application.

The application processor 210 is capable of setting an activated display area based on at least one input in operation 1203.

Figure 13:
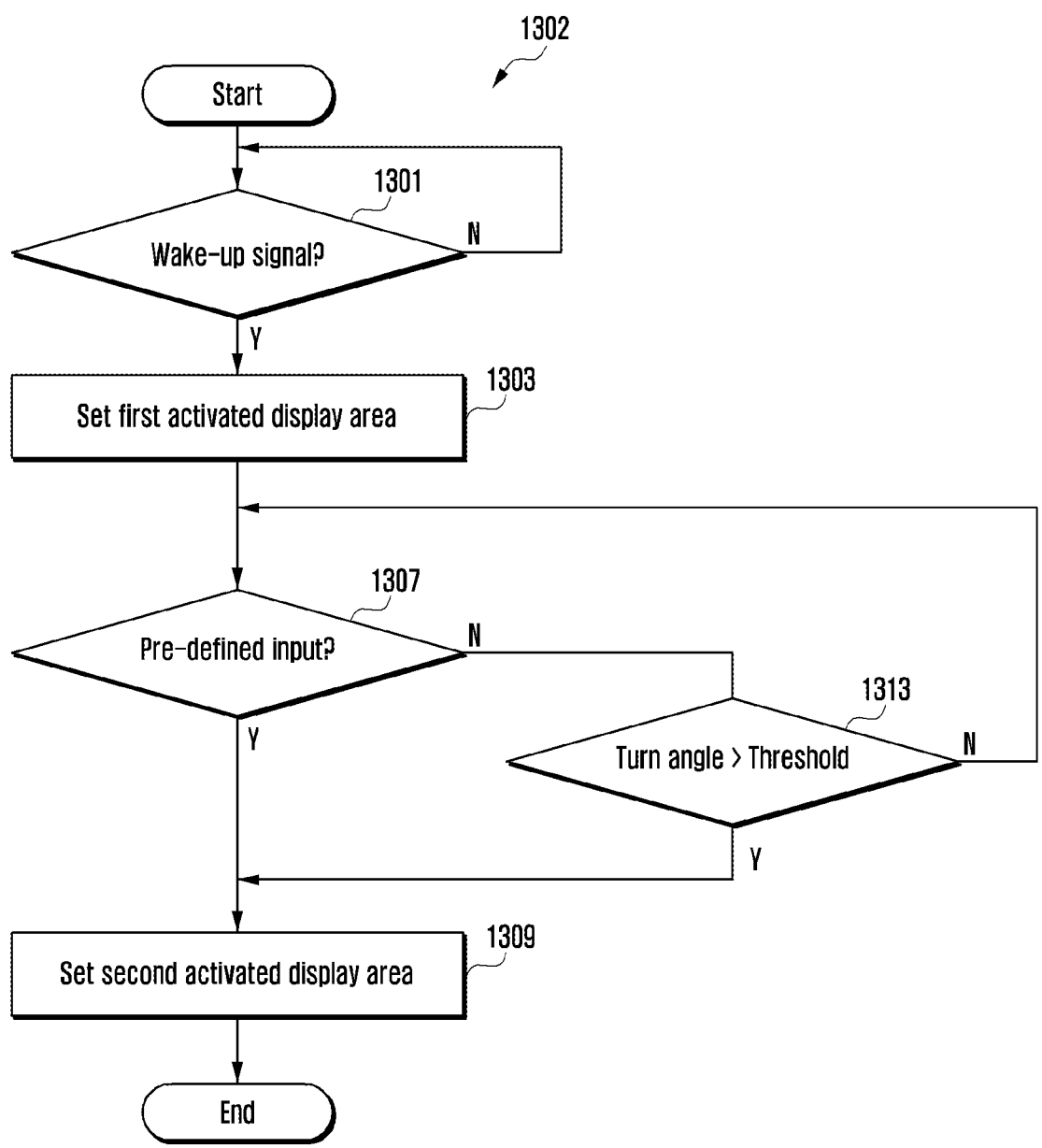
FIG. 13 illustrates a flowchart that describes a method of setting an activated display area, based on at least one input, according to various embodiments of the present invention.
Figure 14:
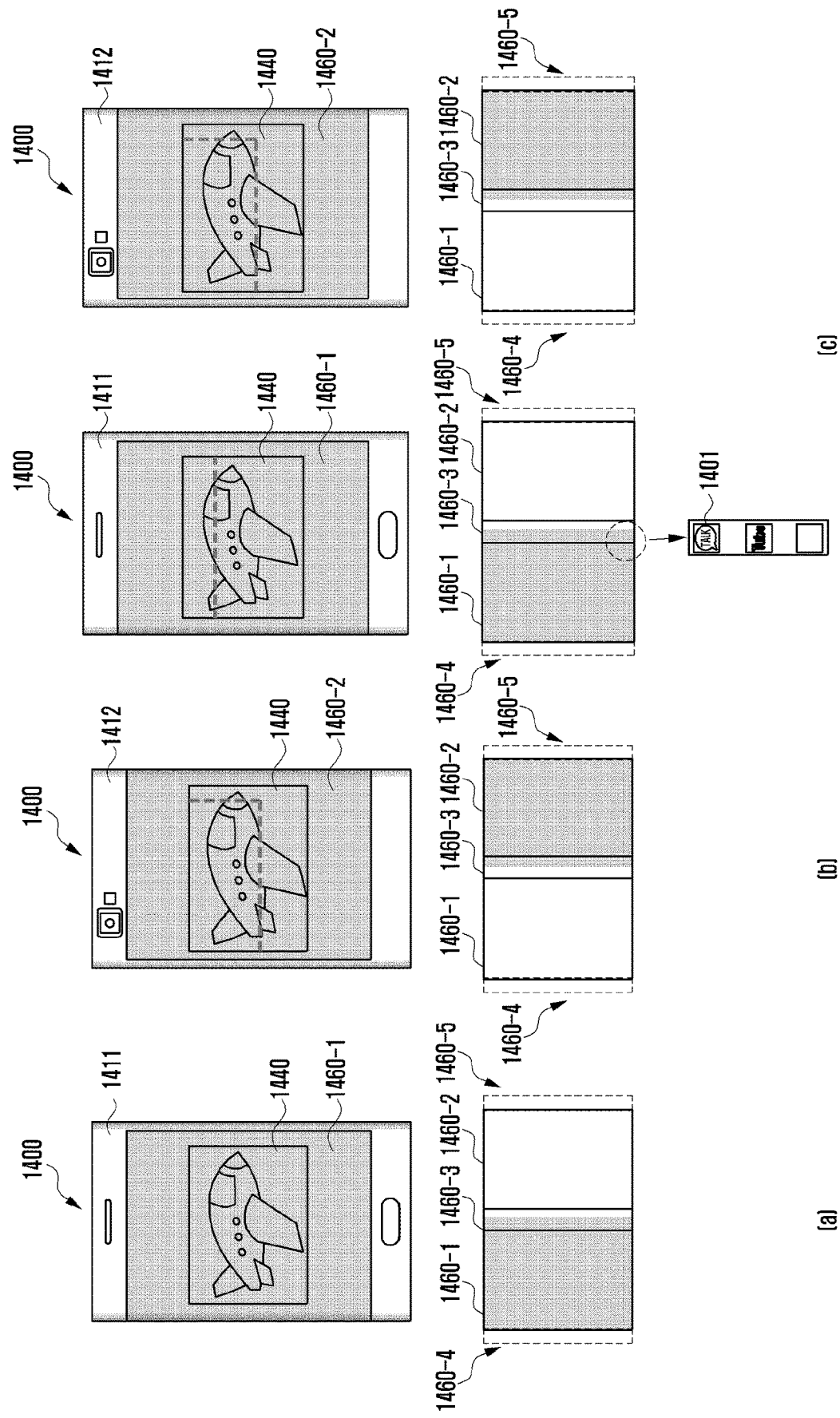
FIG. 14 illustrates diagrams that describe operations of an electronic device adapted to the method of the flowchart as shown in FIG. 13, according to an embodiment of the present invention.
Figure 15:
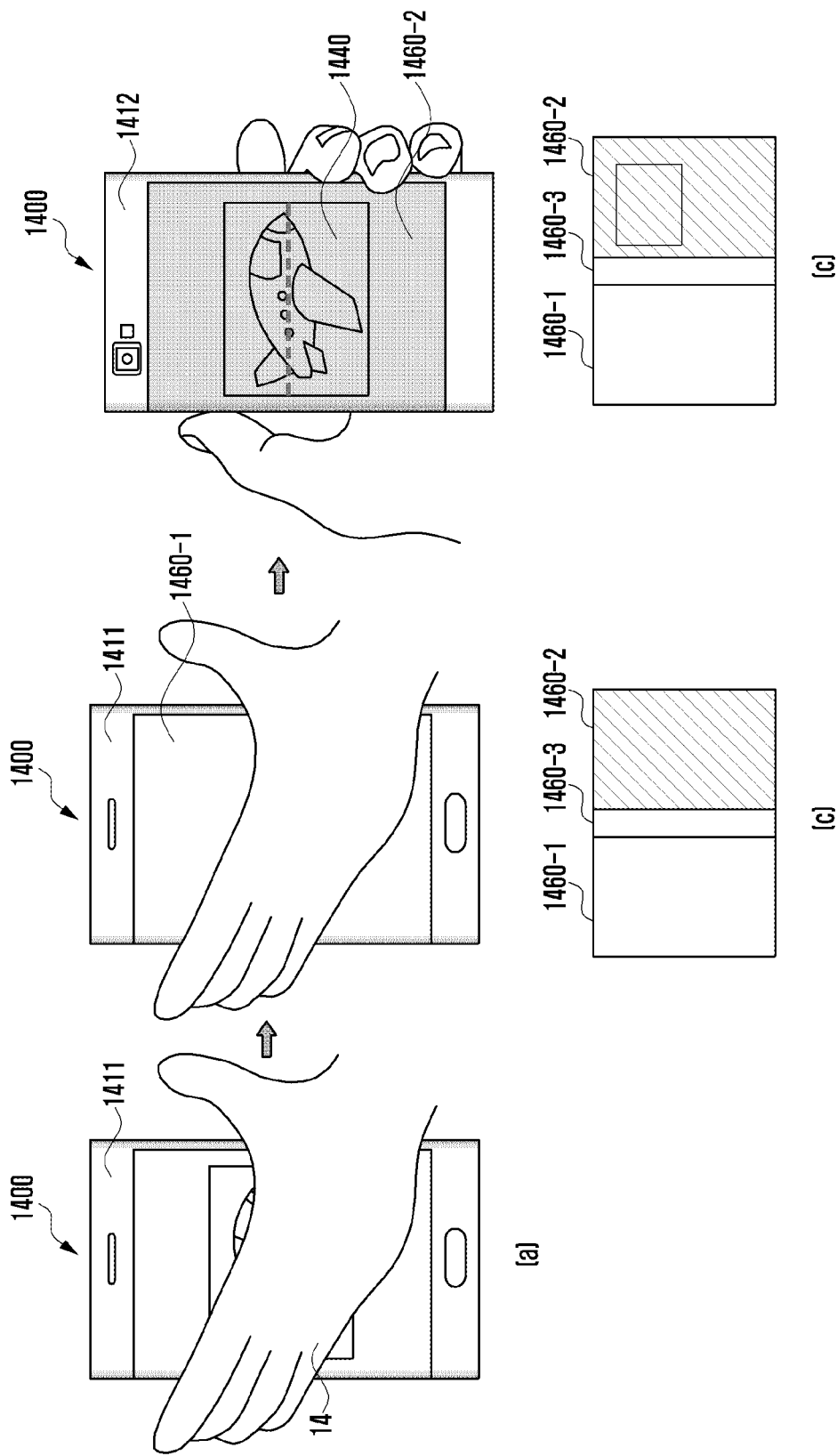
FIG. 15 illustrates diagrams that describe operations of an electronic device adapted to the method of the flowchart as shown in FIG. 13, according to an embodiment of the present invention.

FIG. 13 is a flowchart that describes a method 1302 of setting an activated display area, based on at least one input, according to various embodiments of the present disclosure. FIGS. 14 and 15 show diagrams that describe operations of an electronic device adapted to the method of the flowchart as shown in FIG. 13, according to an embodiment of the present disclosure.

With reference to FIG. 13, when a wake-up signal is generated in an idle mode, the processor (e.g., the application processor 210 shown in FIG. 2) is capable of detecting the wake-up signal in operation 1301. A wake-up signal may be generate by pressing a button, by inputting a pre-defined type of touch, and/or by applying a hovering input, etc. A wake-up signal may be a signal detected by at least one sensor. A wake-up signal may be an incoming call signal, the reception of a text message or a social network service (SNS) message, etc.

The application processor 210 is capable of setting the first activated display area in operation 1303.

With reference to diagram (a) of FIG. 14, if an electronic device 1400 is placed on a flat so that the front side faces upward, the first side 1411 is exposed but the second side 1412 is not exposed. If a hovering input or a touch input, such as a flick gesture, a double tap, etc., is applied to a first display area 1460-1 of the first side 1411, the screen of the first display area 1460-1 is unlocked and displays corresponding content 1440.

If a pre-defined input is generated, the application processor 210 is capable of detecting the pre-defined input in operation 1307. For example, as shown in diagram (a) of FIG. 15, when the user grips the electronic device 1400 with the hand 14, part of the user's hand 14 may continuously apply the touch or hovering input to the display 1460, and this may generate a pre-defined input.

If a pre-defined input is not generated, the application processor 210 measures a turn angle of the electronic device 1400, and determines whether the turn angle is greater than a threshold in operation 1313. If the application processor 210 ascertains that the turn angle is greater than a threshold in operation 1313, it is capable of setting a second activated display area in operation 1309. For example, as shown in diagram (b) of FIG. 14, if the electronic device 1400 is turned over from the position shown in diagram (a) of FIG. 14, so that the second side 1412 is disclosed and the first side 1411 is disclosed, the application processor 210 ascertains that the turn angle of the electronic device is greater than a threshold. The application processor 210: switches the first display area 1460-1 from an activated state to an inactivated state, and the second display area 1460-2 from an inactivated state to an activated state; and displays the content 1440 on the second display area 1460-2.

If a pre-defined input is generated, the application processor 210 is capable of setting a second activated display area in operation 1309. For example, as shown in diagrams (b) and (c) of FIG. 15, if the user grips the electronic device 1400, part of the user's hand 14 may apply the touch or hovering input to first display area 1460-1 of the display 1460, and this may generate a pre-defined input. The application processor 210: switches the first display area 1460-1 from an activated state to an inactivated state, and the second display area 1460-2 from a de-activate state to an activated state; and displays the content 1440 on the second display area 1460-2. Alternatively, the application processor 210 is capable of setting a third activated display area in operation 1303 or 1309. In various embodiments, the activated area and the inactivated area in the third display area 1460-3 may be adjusted according to the content displayed on the first display area 1460-1 or the second display area 1460-2. For example, as shown in diagram (c) of FIG. 14, if content 1440 or an application 1401 related to the content 1440, which needs to be displayed on the first display area 1460-1 or second display area 1460-2, is greater in size than the first display area 1460-1, the application processor 210 is capable of activating part of a third display area 1460-3 by the size of the content 1440 and inactivating the remaining part of the third display area 1460-3. The third display area 1460-3 may be separated from the display via an inactivated area or physically as shown in FIG. 6A or 6B. Alternatively, like an electronic device as shown in FIG. 4, the display 1460 shown in FIG. 14 may further include an additional display area of a fourth display area 1460-4 or fifth display area 1460-5. In this case, like the control of the third display area 1460-3, if content 1440 or an application 2401 related to the content 1440, which needs to be displayed on the first display area 1460-1 or second display area 1460-2, is greater in size than the first display area 1460-1, the application processor 210 is capable of activating part of the fourth display area 1460-3 or fifth display area 1460-5 by the size of the content 1440 and inactivating the remaining part of the fourth display area 1460-4 or fifth display area 1460-5.

Figure 16:
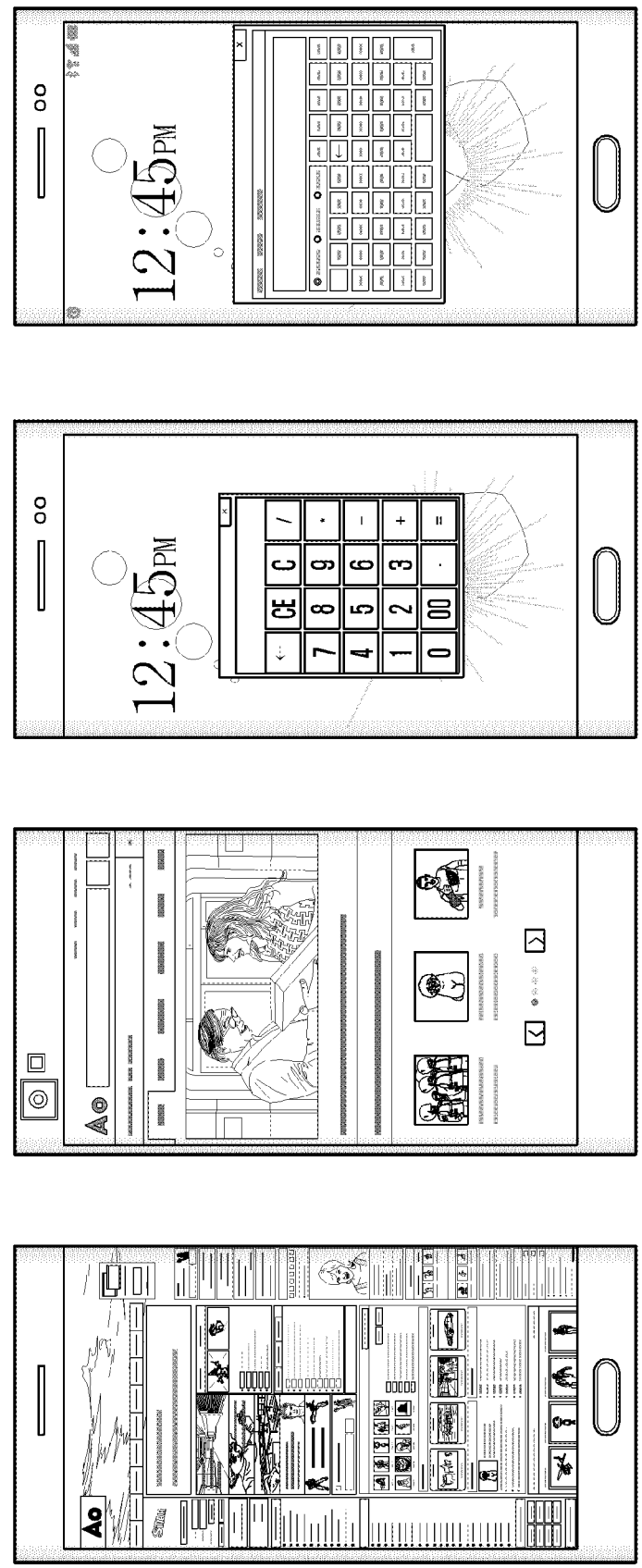
FIG. 16 illustrates diagrams of various types of screen provided by an electronic device according to various embodiments of the present invention.
Figure 18:
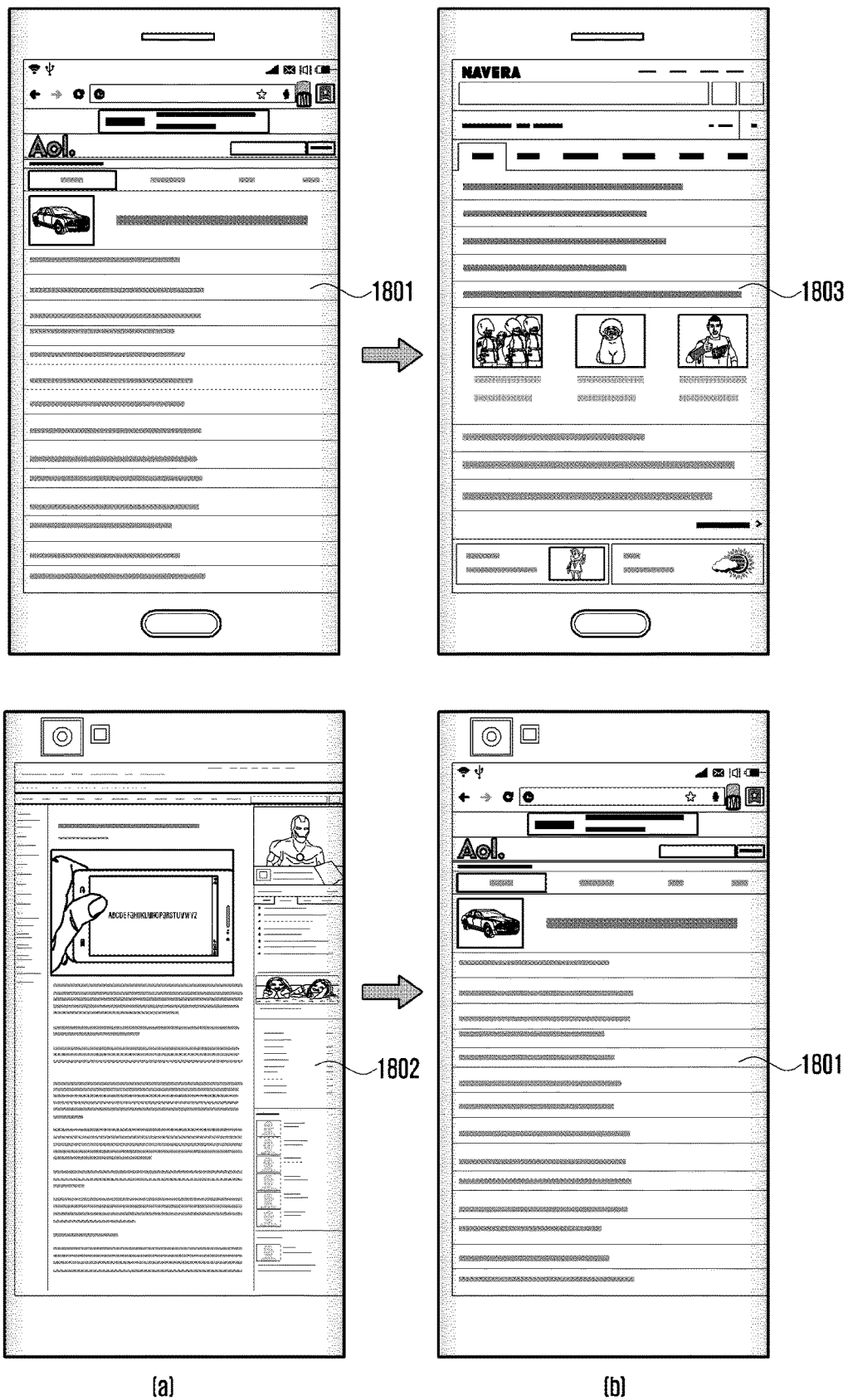
FIG. 18 illustrates diagrams that describe a method of operating an electronic device according to various embodiments of the present invention.
Figure 21:
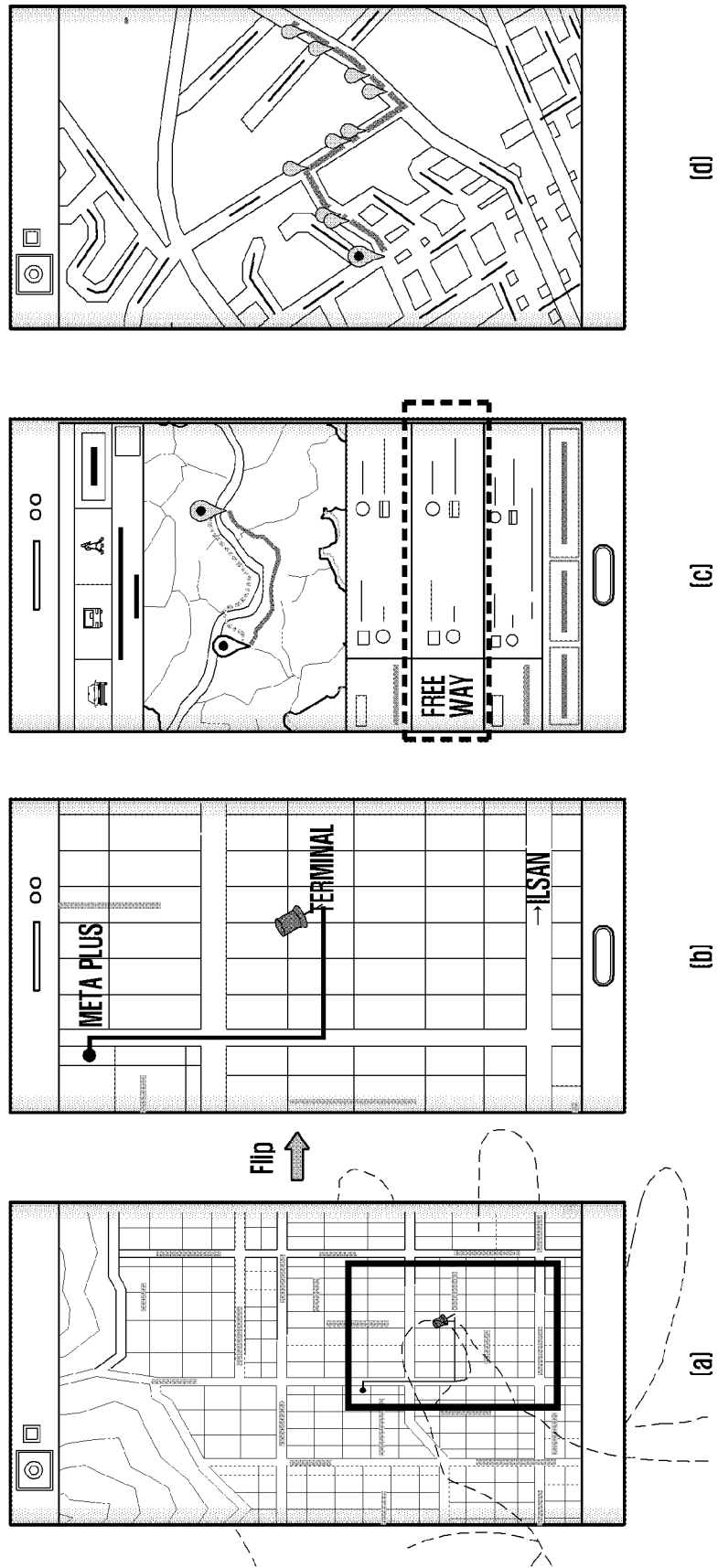
FIG. 21 illustrates diagrams of screens provided by an electronic device according to various embodiments of the present invention.
Figure 22:
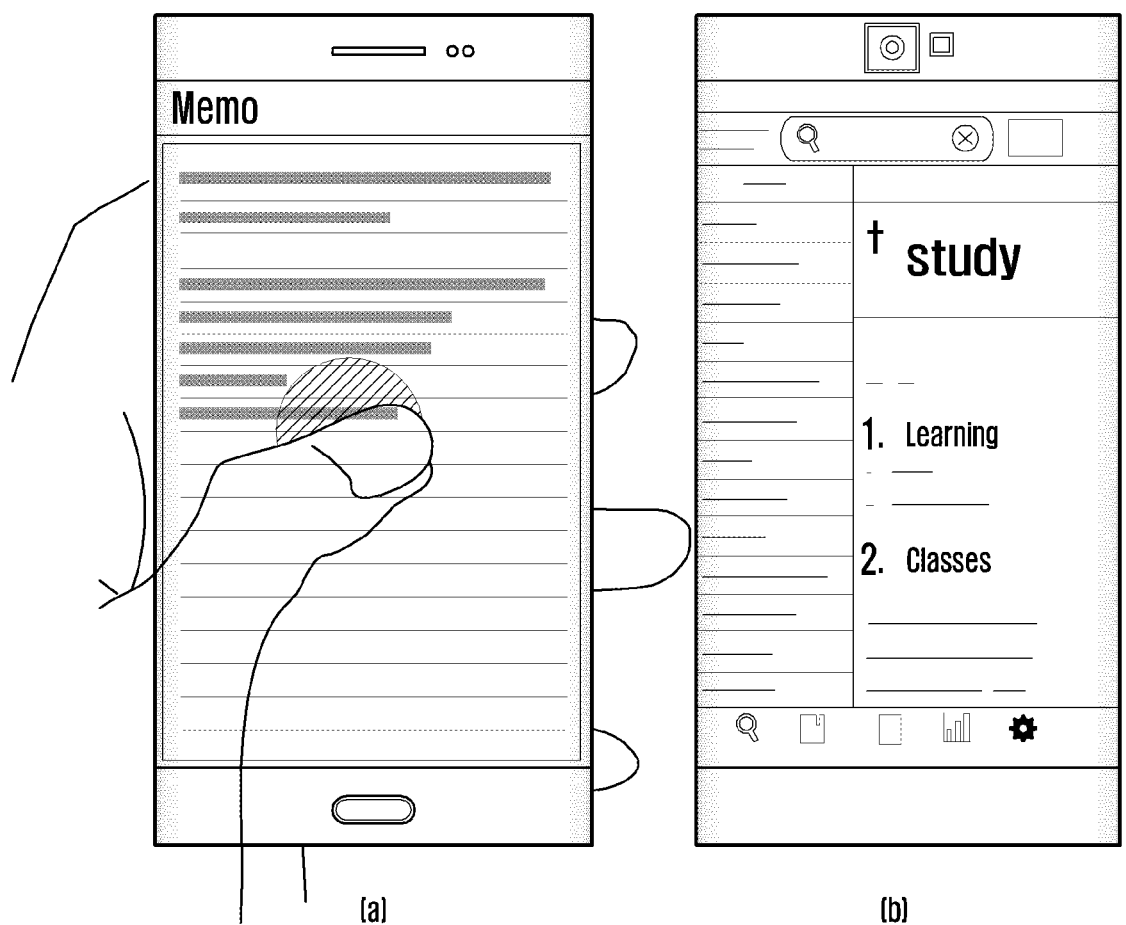
FIG. 22 illustrates diagrams of screens provided by an electronic device according to various embodiments of the present invention.
Figure 24:
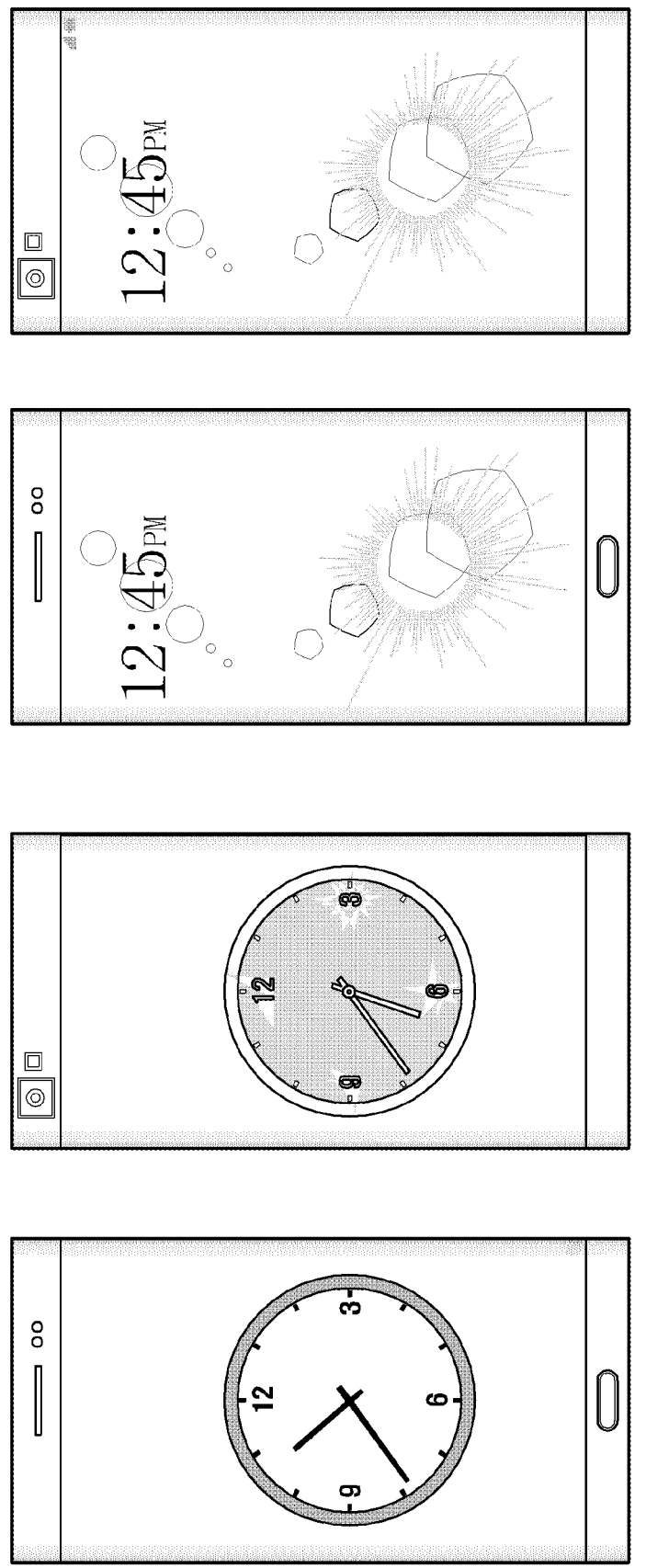
FIG. 24 illustrates diagrams of screens when an electronic device runs a clock application according to various embodiments of the present invention.
Figure 26:
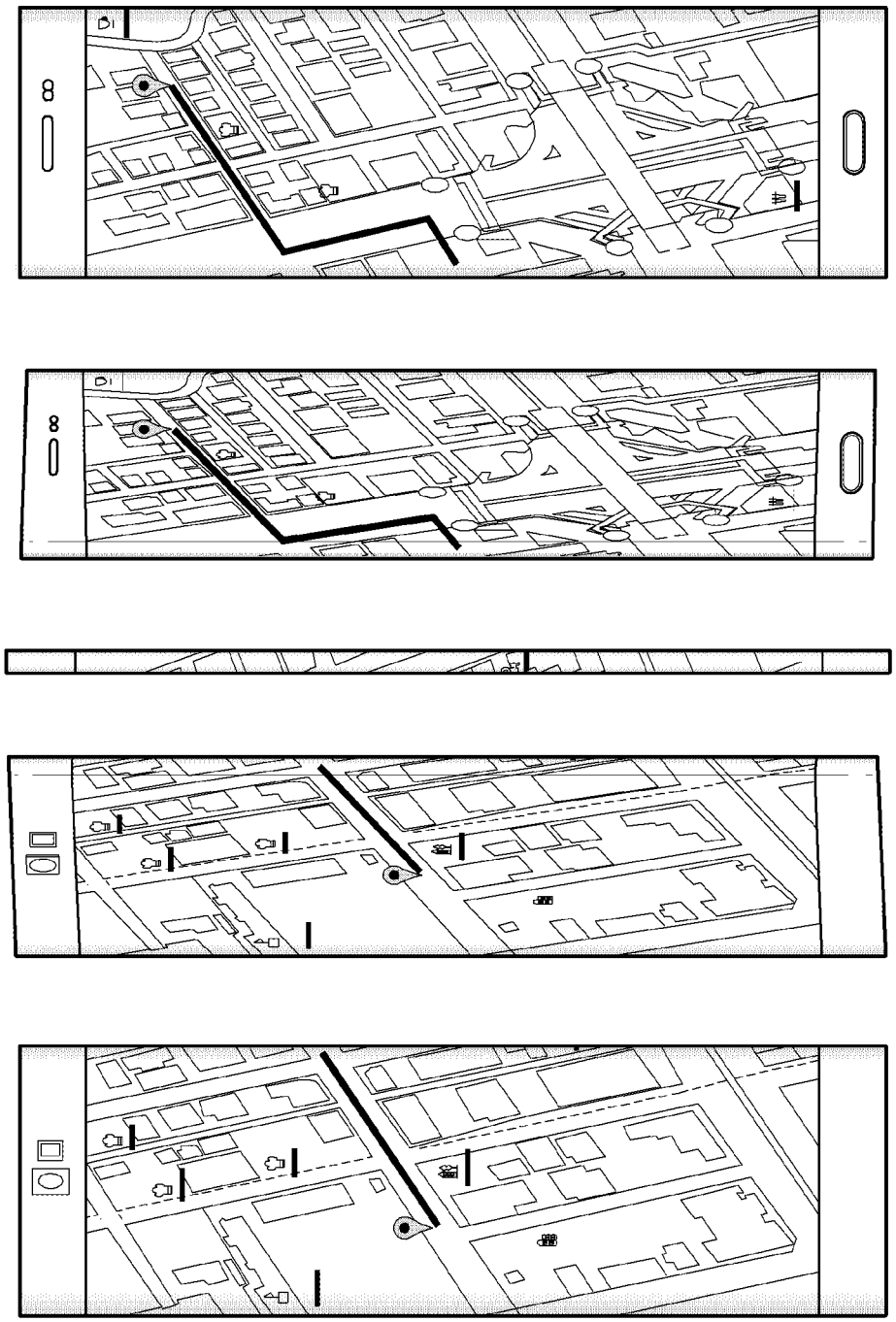
FIG. 26 illustrates diagrams of screens when an electronic device runs a map search application according to various embodiments of the present invention.

FIG. 16 shows diagrams of various types of screen provided by an electronic device according to various embodiments of the present disclosure. FIG. 17 shows diagrams of a background screen provided by an electronic device according to various embodiments of the present disclosure. FIG. 18 shows diagrams that describe a method of operating an electronic device according to various embodiments of the present disclosure. FIG. 19 shows diagrams that describe a method for an electronic device to provide an incoming call notification according to various embodiments of the present disclosure. FIG. 20 shows diagrams that describe a method for an electronic device to provide an incoming call notification according to various embodiments of the present disclosure. FIG. 21 shows diagrams of screens provided by an electronic device according to various embodiments of the present disclosure. FIG. 22 shows diagrams of screens provided by an electronic device according to various embodiments of the present disclosure. FIG. 23 shows diagrams of screens when an electronic device runs a media playback application according to various embodiments of the present disclosure. FIG. 24 shows diagrams of screens when an electronic device runs a clock application according to various embodiments of the present disclosure. FIG. 25 shows diagrams of idle screens when an electronic device operates in an idle mode according to various embodiments of the present disclosure. FIG. 26 shows diagrams of screens when an electronic device runs a map search application according to various embodiments of the present disclosure.

The processor 1110 executes one of a number of applications stored in the memory 1140, referring to the memory 1140, and provides a user interface to at least one display. For example, first, second and third applications may include first, second and third user interfaces respectively. The processor 1110 is capable of executing one of the applications, and providing different user interface screens to first to third displays, respectively.

In an embodiment, as shown in FIG. 16, the processor 1110 controls the first and second displays to display: screens on which the same application is running; and the same information included in the execution screens in different forms, respectively. For example, as shown in diagrams (a) and (b) of FIG. 16, an example of the application executed by the processor 1110 is a web-browser. The processor 1110 executes a web-browser and controls the first and second displays to display web screens respectively. In this case, the processor 1110 may allow the first and second displays to show the web-browser screens in different forms respectively. For example, as shown in diagram (a) of FIG. 16, the processor 1110 may provide a web screen of a "PC version" to the first display of the front side of the electronic device. On the other hand, as shown in diagram (b) of FIG. 16, the processor 1110 may provide a web screen of a "mobile version" to the second display of the rear side of the electronic device. Another example of the application executed by the processor 1110 is a calculator application. The processor 1110 executes a calculator application and controls the first and second displays to display calculator screens respectively. In this case, the processor 1110 may allow the first and second displays to show the calculator screens in different forms respectively. For example, as shown in diagram (c) of FIG. 16, the processor 1110 may provide a calculator screen of a "basic calculator" form to the first display of the front side of the electronic device. On the other hand, as shown in diagram (d) of FIG. 16, the processor 1110 may provide a calculator screen of a "scientific calculator" form to the second display of the rear side of the electronic device.

The processor 1110 is capable of controlling the first and second displays to display background screens (home screens) that differ from each other, respectively. For example, as shown in diagram (a) of FIG. 17, the processor 1110 controls the first display to display a background screen of a first type. Simultaneously, as shown in diagram (b) of FIG. 17, the processor 1110 also controls the second display to display a background screen of a second type. The background screen of a first type may be a default home screen provided by smartphone manufacturers. For example, the background screen of a first type may show icons corresponding to a number of applications and a folder containing at least one icon. The background screen of a second type may be a screen provided when a smartphone runs in an easy mode. For example, the background screen of a second type may show icons larger in size and less in number than the background screen of a first type. For example, the background screen of a second type may only show icons corresponding to frequently used applications, e.g., a call function, a camera function, an Internet function, a messenger function, etc. The electronic device according to an embodiment is capable of displaying a user interface provided by one application on multiple displays in various modes that differ from each other, thereby increasing user convenience.

In an embodiment, as shown in FIG. 18, the processor 1110 is capable of executing one of a number of applications, switching a screen displayed on a display (display 1) in response to a user input, and performing, when the screen displayed on the display (display 1) is switched, a control operation so that a screen previously displayed on the display (display 1) can be displayed on another display. For example, the application execute by the processor 1110 may be a web-browser. The processor 1110 is capable of providing: a first web screen 1801 of the web-browser executed on the first display, and a first user interface; and a second web screen 1802 on the second display. The screen displayed on the second display may not be a second web screen, but may be a second user interface according to the execution of another application. In response to a user input via the first user interface, the processor 1110 is capable of switching: a first web screen 1801 displayed on the first display into a third web screen 1803; and a second web screen 1802 displayed on the second display into the first web screen 1801. While a web screen is switched on the first display, if the second display provides a second user interface according to the execution of another application, the processor 1110 is capable of performing a control operation so that the second display can provide a previous screen of the first display from the second user interface. The electronic device according to an embodiment is capable of controlling, using a multiple display device, one display to display a previous screen provided by another display, thereby increasing user convenience.

In an embodiment, when the electronic device receives a call, the processor 1110 provides a notification of an incoming call to a first or second display. The processor 1110 may also provide a notification of an incoming call in other mode. For example, the processor 1110 may provide a notification in various modes according to positions (postures) of an electronic device. As shown in diagram (a) of FIG. 19, when the electronic device is placed so that the first display faces upwards and the second display faces downwards, the processor 1110 is capable of displaying a caller's phone number and information regarding the caller on the first display, and also providing a ringtone or a vibration notification. On the other hand, as shown in diagram (b) of FIG. 19, when the electronic device is placed so that the first display faces downwards and the second display faces upwards, the processor 1110 is capable of displaying only a caller's phone number on the second display, without providing a ringtone and a vibration notification.

As another example, if the electronic device receives a phone call, the processor 1110 is capable of: providing a caller's phone number and information regarding the caller to the first display; and controlling the second display to display a screen previously displayed on the first display. For example, as shown in FIG. 20, when the electronic device receives a call while the user is using an application "SMON", the processor 1110 is capable of displaying: a caller's phone number and information regarding the caller on the first display as shown in diagram (a) of FIG. 20. Simultaneously, the processor 1110 is capable of displaying a user interface of the application "SMON", previously displayed on the first display before receiving the call, on the second display as shown in diagram (b) of FIG. 20. When terminating the call, the user can resume using the application that the user has used via the second display.

In an embodiment, the processor 1110 is capable of controlling one display to display information of a screen currently displayed on another display. For example, the processor 1110 is capable of: executing one of a number of applications; providing a first user interface to one display; and controlling one display to display information of the first user interface on another display, via the first user interface, in response to a user input. For example, as shown in diagrams (a) and (b) of FIG. 21, the processor 1110 is capable of executing a map search application and providing a map screen to the first display. The processor 1110 receives and detects a user input selecting a specified region on the first display via the first user interface, and displays a detailed map screen corresponding to the specified region on the second display. The user input selecting a specified region may be one or more of the following: a single touch, a multi touch, a tap/touch, and a pressure touch. For example, when a user needs to zoom in on a location where a terminal is located on the map screen on the first display, the user may apply multi-touches to the location where the terminal is located on the map screen. The processor 1110 detects the multi-touches, identifies the multi-touched region, and displays a map enlarging the location on the second display. As another example, as shown in diagrams (c) and (d) of FIG. 21, the processor 1110 is capable of executing a destination search application, and displaying, on the first display, a screen providing offered paths according to the destination search. The processor 1110 receives and detects a user input selecting one of the offered paths on the first display, via the first user interface, and displays the selected, offered path, in detail, on the second display.

As another example, the processor 1110 is capable of executing a dictionary search application. For example, as shown in diagram (a) of FIG. 22, the processor 1110 is capable of providing the first display with a list of words according to the dictionary search result. The processor 1110 is capable of detecting a user input selecting one of the words on list on the first display via a first user interface. As shown in diagram (b) of FIG. 22, when the processor 1110 receives the user input, it is capable of providing the user's selected word, the definition, the related words, etc., to the second display. It should be understood that the processor 1110: may execute various applications as well as the map search application, the destination search application, and the dictionary search application; and may enable one of a number of displays to display information or information related to a screen previously provided to another display.

In an embodiment, the processor 1110 is capable of executing a media playback application. For example, as shown in diagram (a) of FIG. 23, the processor 1110 is capable of executing a media playback application and providing a playlist to the first display. Simultaneously, as shown in diagram (b) of FIG. 23, the processor 1110 is capable of providing the second display with shortcut keys for controlling media playback (e.g., a hot key). The shortcut keys may include a number of buttons: previous, next, paly, pause, stop, etc., and an album jacket, etc. The processor 1110 may also control the second display to provide preset shortcut keys, e.g., shortcut keys for providing a camera function, a picture-memo function, etc.

In an embodiment, the processor 1110 is capable of executing a clock application. The processor 1110 is capable of executing a clock application according to a user input or when the electronic device is in a screen-lock sate (or an idle mode). When the clock application is executed, the processor 1110 is capable of displaying clock information in one form on the first display and in another form on the second display. For example, as shown in diagrams (a) and (b) of FIG. 24, the processor 1110 is capable of providing the first and second displays with the clock images that differ in design and color from each other. For example, the processor 1110 is capable of displaying an analog clock on the first display and a digital clock on the second display. The processor 1110 is capable of displaying an analog clock on both of the first and second displays. In this case, the processor 1110 may set the analog clocks displayed on the first and second displays to differ from each other in outer border, background, hand, or size. As shown in diagrams (c) and (d) of FIG. 24, the processor 1110 is capable of providing the same screen to the first and second displays.

In an embodiment, the processor 1110 is capable of executing an idle screen application, and providing the first and second displays with idle screens in different forms. For example, as shown in diagram (a) of FIG. 25, the processor 1110 is capable of controlling the first display of the front side of the electronic device to display an image stored in the memory as an idle screen. The idle screen may be displayed, on the first display, as a still image or images varying at a specified time interval. As shown in diagram (b) of FIG. 25, the processor 1110 is capable of controlling the second display of the rear side of the electronic device to display weather information. Weather information may contain daily and weekly weather information. In this case, the idle screen of the second display may be set to display the current weather information.

In an embodiment, the processor 1110 is capable of displaying successive screens on a number of displays. The processor 1110 is capable of executing an application in response to a user input, and displaying parts of one screen of the executed application, successively, on first to third displays. For example, as shown in FIG. 26, the processor 1110 is capable of executing a map search application. The processor 1110 is capable of displaying parts of the map screen created according to the map search application, successively, on the first to third displays. For example, the processor 1110 is capable of dividing a specified local area on the map into a number of areas. The processor 1110 displays: a map image corresponding to a first area on the first display; a map image corresponding to a second area, adjacent to the first area, on the third display extended from the first display; and a map image corresponding to a third area, adjacent to the second area, on the second display that is extended from the third display and located opposite the first display. In another embodiment, the processor 1110 may also execute a photo gallery application, a game application, etc., and display parts of one screen of the executed application, successively, on a number of displays.

Figure 27:
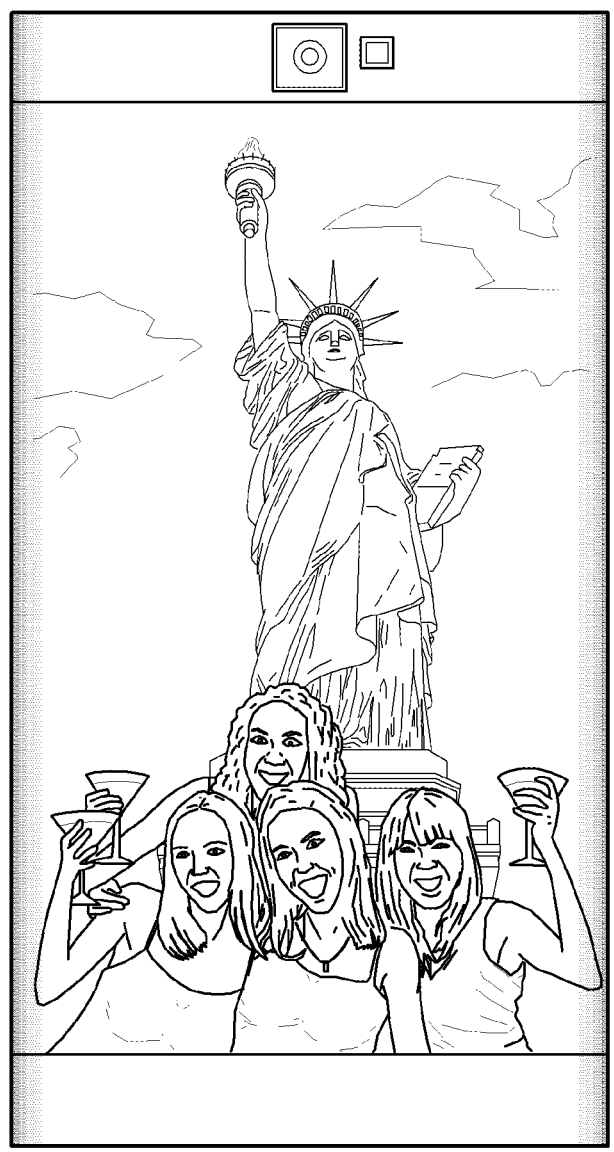
FIG. 27 illustrates a diagram of a screen when an electronic device runs a photography application according to various embodiments of the present invention.

In an embodiment, the processor 1110 is capable of executing a photography application using a camera. As shown in FIG. 27, the processor 1110 is capable of executing a photography application, and displaying a preview screen taken by the camera on the second display located in the same side as the camera. Since the electronic device according to an embodiment is configured to a display with a number of display areas/sides/image-display areas, although the camera module is installed to only the rear side, the electronic device allows the user to take pictures while previewing the current screen via the display of the rear side. Therefore, the electronic device according to an embodiment does not require camera modules for the front side and rear side, thereby reducing the number of parts. In general, since the rear facing camera has performance higher than the front facing camera that is usually used to take a selfie, the electronic device with the multiple display areas/multiple displays/multiple image-display areas, according to the present disclosure, allows the user to take a selfie and other pictures with high quality using the rear facing camera.

Figure 28:
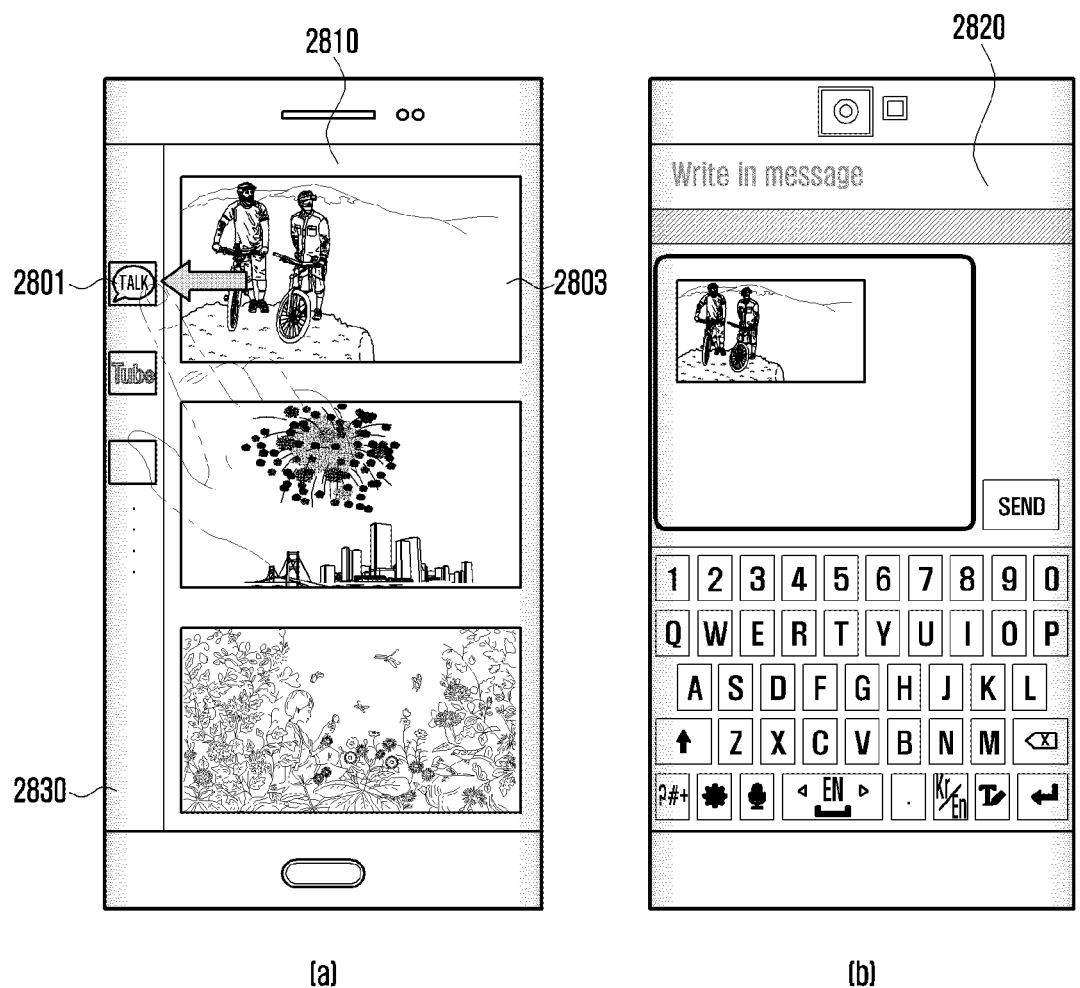
FIG. 28 illustrates diagrams that describe a method of operating an electronic device according to various embodiments of the present invention.
Figure 29:
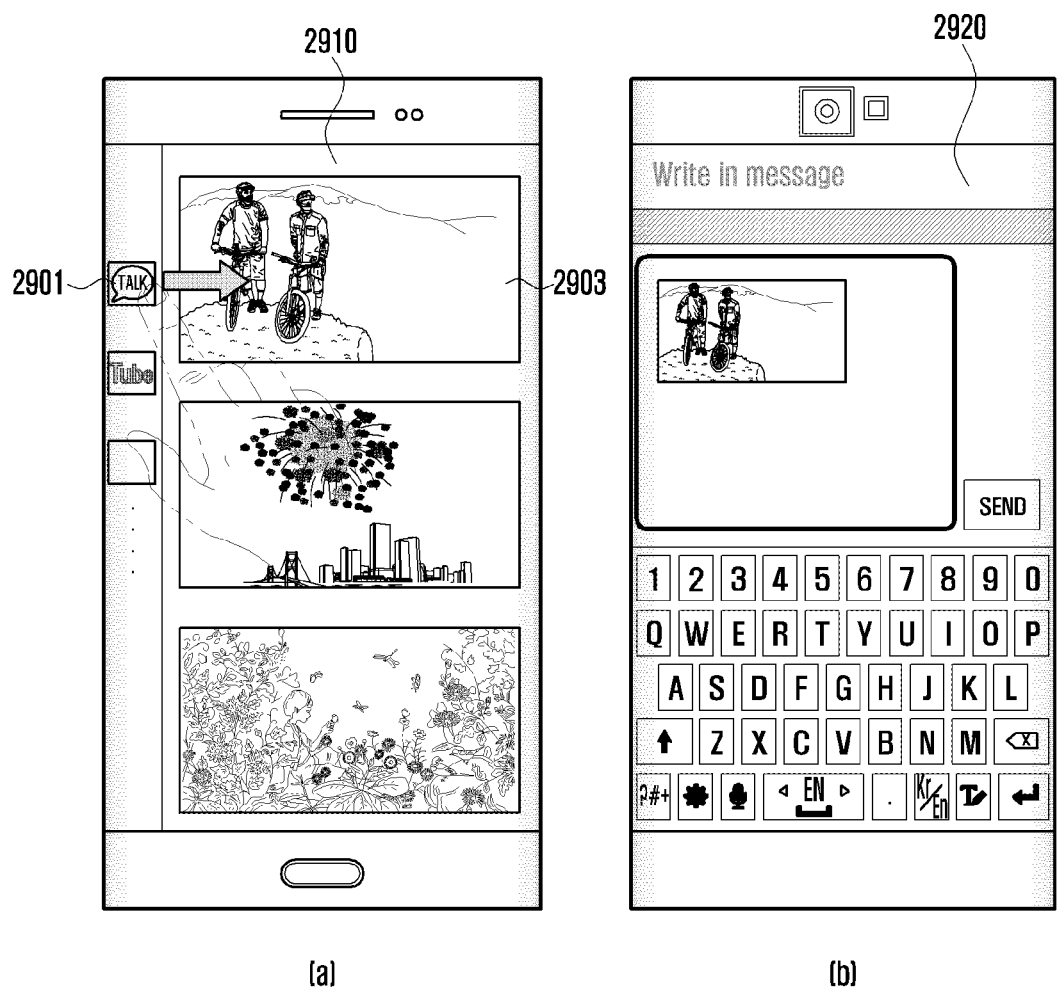
FIG. 29 illustrates diagrams that describe a method of operating an electronic device according to various embodiments of the present invention.

FIG. 28 shows diagrams that describe a method of operating an electronic device according to various embodiments of the present disclosure. FIG. 29 shows diagrams that describe a method of operating an electronic device according to various embodiments of the present disclosure. FIG. 30 shows diagrams that describe a method of operating an electronic device according to various embodiments of the present disclosure. FIG. 31 shows diagrams that describe a method of operating an electronic device according to various embodiments of the present disclosure.

In an embodiment, the processor 1110 is capable of displaying a list of applications on the third display 2830, and controlling a user interface (screen) that the first and second displays 2810 and 2820 provides in connection with the application list display screen. For example, the processor 1110 is capable of executing a first application, and providing a first user interface according to the execution of the first application to the first display 2810 of the front side of the electronic device. The first application may include a photo gallery application or a map search application. The processor 1110 is capable of providing an icon (or text) 2801 for directly executing a second application on the third display 2830. The second application may include a messenger application for transmitting messages, an email sending application for transmitting emails or a social networking service (SNS) application.

With reference to FIG. 28, the processor 1110 is capable of receiving a first user input selecting a specified object 2803 displayed on the first display 2810 via the first user interface. When receiving the first user input, the processor 1110 is capable of receiving a second user input selecting one of the second applications displayed on the third display 2830. The second user input includes a user action for dragging an object 2803 selected on the first display 2810 to an icon 2801 of the second application displayed on the third display 2830. The processor 1110 is capable of executing the second application, based on the second user input, and providing a second user interface according to the execution of the second application to the second display 2820 of the rear side of the electronic device. The processor 1110 is capable of providing a second user interface to the second display 2820, and performing linkify to link the object 2803, selected on the first display 2810 according to the first user input, with the second user interface. For example, the object selected according to the first user input may be an image 2803 displayed on the first display 2810. The processor 1110 is capable of attaching the image 2803, via the second user interface screen provided by the second display 2820, based on the second user input.

In an embodiment, it should be understood that the first and second user inputs may be applied to the display in differ order. For example, as shown in FIG. 29, the processor 1110 first receives a second user input selecting the second application and then a first user input selecting an object of the first display 2910, and executing the second application. The processor 1110 is capable of providing the second user interface to the second display 2920, according to the execution of the second application. The first user input may include a user action for dragging a corresponding icon 2901 of the second application in the direction of the object 2903.

In another embodiment, a first application that is executed may be a map search application, and an object selected by a first user input may be a specified location on a map. The processor 1110 is capable of attaching coordinates of the specified location via a second user interface screen displayed on the second display 2920, in response to a second user input. For example, an object selected by the first user input may be an image or a map showing a specified local area. The processor 1110 is capable of executing the second application based on the second user input. For example, as shown in diagram (a) of FIG. 30, the second application may be a web-browser 3010 or a map search application 3020. For example, as shown in diagram (b) of FIG. 3, the processor 1110 is capable of executing a web-browser based on the second user input, and searching for an image or map selected by the first user input, using a search engine executed by the web-browser. As shown in diagram (c) of FIG. 3, the processor 1110 is capable of executing a map search application, and searching for a map corresponding to a map or an image selected by the first user input.

The operations of the embodiment may be repeatedly performed. The processor 1110 is capable of: selecting a specified object, based on a first user input for one of the first and second displays; dragging the selected object to execute an application; and providing a user interface of the executed application to the opposite display, and the processor 1110 repeats the operations.

As shown in diagrams (a) and (b) of FIG. 31, when the user selects and moves a first object on the second display of the rear side of the electronic device, the processor 1110 is capable of providing a first user interface screen of a first application, selected by the user, via the first display opposite the second display. As shown in diagrams (b) and (c) of FIG. 31, if the user selects and moves a second object on the first display via the first user interface, the processor 1110 is capable of providing a second user interface screen of a second application, selected by the user, via the first display. Therefore, the user can repeatedly turn over the electronic device and execute a selected object and application.

As described above, according to an embodiment of the present disclosure, since the electronic device is configured to include a rail member into which a bent part of a middle frame is slidably fitted from the end, it can be easily assembled with the multiple display device of a number of displays/display areas, thereby increasing the productivity and yield.

According to an embodiment of the present disclosure, the electronic device is configured to include a user operation button (user operation buttons) of a non-protrusion type of metal key on the side (sides), thereby improving the aesthetics of design.

According to an embodiment of the present disclosure, the electronic device is capable of displaying a user interface provided by one application on a number of display areas in various forms, thereby providing user convenience.

According to an embodiment of the present disclosure, the electronic device is capable of controlling one display to display a pervious screen provided by another display, using a multiple display, thereby increasing user convenience.

According to an embodiment of the present disclosure, the electronic device is capable of displaying, on one of a number of displays/display areas, information of a screen currently displayed another display/display area, thereby providing user convenience.

According to an embodiment of the present disclosure, the electronic device is capable of displaying successively parts of one screen, relatively large in size, on a number of displays/display areas, so that the user can view the large screen simultaneously, thereby providing user convenience.

According to an embodiment of the present disclosure, the electronic device with a multiple display device does not require camera modules for the front side and rear side, thereby reducing the number of parts. Since the rear facing camera has performance higher than the front facing camera that is usually used to take a selfie, the electronic device is capable of obtaining photos with high quality using the rear facing camera.

According to an embodiment of the present disclosure, the electronic device is capable of displaying a list of applications on a display of one of the sides, and performing linkify on an object, displayed on a display of the front or rear side, to a specified application, according to a user input in connection with the application list, thereby providing a convenient user interface.

A programming module according to embodiments of the present disclosure may include one or more of the aforementioned components or may further include other additional components, or some of the aforementioned components may be omitted. Operations executed by a module, a programming module, or other component elements according to various embodiments of the present disclosure may be executed sequentially, in parallel, repeatedly, or in a heuristic manner. Further, some operations may be executed according to another order or may be omitted, or other operations may be added.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An electronic device comprising:
   a housing including:
      a first surface facing a first direction,
      a second surface facing a second direction opposite the first direction, and
      a side surface located on at least one side of the first and second surfaces;
   a display including:
      a first image-display area on the first surface,
      a second image-display area on the second surface, and
      third image-display areas on the side surface;
   a communication circuit configured to perform wireless communication with an external device;
   a processor located in the housing and electrically connected to the display and the communication circuit; and
   a memory located in the housing, electrically connected to the processor, and configured to store a first application with a first user interface, a second application with a second user interface,
   wherein the memory is further configured to store instructions that cause the processor to:
   display the first user interface on the first image-display area while the first application is being executed;
   display text or icons related to the second application on the third image-display area;
   receive a first user input for selecting an object of the first user interface;
   receive, after receiving the first user input, a second user input for dragging the object located in the first image-display area to the text or the icons located in the third image-display area; and
   in response to the second user input:
      execute the second application,
      display the second user interface on the second image-display area; and insert the object located in the first image-display area to the second user interface located in the second image-display area.

2. The electronic device of claim 1, wherein:
the first application comprises a photo gallery application; and
the second application comprises at least one message sending application or email sending application.

3. The electronic device of claim 1, wherein at least one of the third image-display areas extends from an edge of the first image-display area to an edge of the second image-display area.

4. The electronic device of claim 1, wherein
the side surface includes a curved surface.

5. The electronic device of claim 1, wherein the instructions enable the processor to:
switch a first screen displayed on the first image-display area to a second screen in response to a third user input; and
display the first screen on the second image-display area, when switching the first screen to the second screen on the first image-display area.

6. The electronic device of claim 1, wherein the memory is further configured to store instructions that cause the processor to control the first and second image-display areas to display: screens on which a same application is running; and a same information included in execution screens in different forms, respectively.

7. The electronic device of claim 1, wherein the memory is further configured to store instructions that cause the processor to:
control the first image-display area to display an execution screen of a specific application, and
in response to a user input for selecting at least one object of the execution screen located in the first image-display area, control the second image-display area to display information related to the at least one object of the execution screen.

8. The electronic device of claim 1, wherein the memory is further configured to store instructions that cause the processor to control the first to third image-display areas to display different parts of the execution screen of a third application respectively, wherein the different parts of the execution screen are successively connected to each other on the first to third image-display areas.

9. The electronic device of claim 8, wherein the third application comprises:
a map search application or a photo gallery application.

10. A method of operating an electronic device that includes a housing including a first surface facing a first direction, a second surface facing a second direction opposite the first direction, and a side surface located on at least one side of the first and second surfaces; and a display including a first image-display area on the first surface, a second image-display area on the second surface, and third image-display area on the side surface, the method comprising:
executing a first application, and displaying a first user interface on the first image-display area;
displaying text or icons related to a second application on the third image-display area;
receiving a first user input for selecting an object of first user interface;
receiving, after receiving the first user input, a second user input for dragging the object located in the first image-display area to the text or the icons located in the third image-display area; and
in response to the second user input:
executing the second application;
displaying a second user interface on the second image-display area; and
inserting the object located in the first image-display area to the second user interface located in the second image-display area.

11. The method of claim 10, wherein:
the first application comprises a photo gallery application; and
the second application comprises at least one message sending application or email sending application.

12. The method of claim 10, further comprising:
switching a first screen displayed on the first image-display area to a second screen in response to a third user input; and
displaying the first screen on the second image-display area, when switching the first screen to the second screen on the first image-display area.

13. The method of claim 10, further comprising:
executing a third application in response to a user input; and
controlling the first to third image-display areas to display different parts of the execution screen of the third application respectively,
wherein the different parts of the execution screen are successively connected to each other on the first to third image-display areas.

14. A non-transitory computer-readable recording medium having stored thereon one or more computer programs including instructions that, when executed by at least one processor of an electronic device that includes a housing including a first surface facing a first direction, a second surface facing a second direction opposite the first direction, and a side surface located on at least one side of the first and second surfaces; and a display including a first image-display area on the first surface, a second image-display area on the second surface, and third image-display areas on the side surface, control the electronic device to perform operations comprising:
executing a first application, and displaying a first user interface on the first image-display area;
displaying text or icons related to a second application on the third image-display area;
receiving a first user input for selecting an object of first user interface;
receiving, after receiving the first user input, a second user input for dragging the object located in the first image-display area to the text or the icons located in the third image-display area; and
in response to the second user input:
executing the second application;
displaying a second user interface on the second image-display area; and
inserting the object located in the first image-display area to the second user interface located in the second image-display area.

15. An electronic device comprising:
a housing including:
a first surface facing a first direction,
a second surface facing a second direction opposite the first direction, and
a side surface located on at least one side of the first and second surfaces;
a display including:
a first image-display area on the first surface,
a second image-display area on the second surface, and third image-display areas on the side surface;
a communication circuit configured to perform wireless communication with an external device;
a processor located in the housing and electrically connected to the display and the communication circuit; and
a memory located in the housing, electrically connected to the processor, and configured to store a first application with a first user interface, a second application with a second user interface,
wherein the memory is further configured to store instructions that cause the processor to:
  display the first user interface on the first image-display area while the first application is being executed;
  display text or icons related to the second application on the third image-display area;
  receive a first user input for selecting the text or the icons located in the third image-display area;
  receive, after receiving the first user input, a second user input for dragging the selected text or the icons in the third image-display area to an object of the first user interface located in the first image-display area; and
  in response to the second user input:
    execute the second application,
    display the second user interface on the second image-display area; and
    insert the object located in the first image-display area to the second user interface located in the second image-display area.

16. A method of operating an electronic device that includes a housing including a first surface facing a first direction, a second surface facing a second direction opposite the first direction, and a side surface located on at least one side of the first and second surfaces; and a display including a first image-display area on the first surface, a second image-display area on the second surface, and third image-display areas on the side surface, the method comprising:
  executing a first application, and displaying a first user interface on the first image-display area;
  displaying text or icons related to a second application on the third image-display area;
  receiving a first user input for selecting the text or the icons located in the third image-display area;
  receiving, after receiving the first user input, a second user input for dragging the selected text or the icons in the third image-display area to an object of the first user interface located in the first image display area; and
  in response to the second user input:
    executing the second application;
    displaying the second user interface on the second image-display area; and
    inserting the object located in the first image-display area to the second user interface located in the second image-display area.

* * * * *